United States Patent
Lee et al.

(10) Patent No.: US 10,700,145 B2
(45) Date of Patent: Jun. 30, 2020

(54) ELECTRONIC DEVICE WITH TOUCH SENSOR

(71) Applicant: LG ELECTRONICS INC., Seoul (KR)

(72) Inventors: Byunghwa Lee, Seoul (KR); Sehyung Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/404,544

(22) Filed: May 6, 2019

(65) Prior Publication Data

US 2019/0259819 A1 Aug. 22, 2019

Related U.S. Application Data

(63) Continuation of application No. 15/673,257, filed on Aug. 9, 2017, now Pat. No. 10,355,059.

(30) Foreign Application Priority Data

Mar. 30, 2017 (KR) .................. 10-2017-0040991

(51) Int. Cl.
*G06F 3/045* (2006.01)
*H01L 27/32* (2006.01)
(Continued)

(52) U.S. Cl.
CPC ........ *H01L 27/323* (2013.01); *G02F 1/13338* (2013.01); *G06F 1/1626* (2013.01);
(Continued)

(58) Field of Classification Search
CPC . H01L 27/323; G02F 1/13338; G06F 1/1626; G06F 1/203
(Continued)

(56) References Cited

U.S. PATENT DOCUMENTS

2008/0202251 A1 8/2008 Serban et al.
2009/0257189 A1* 10/2009 Wang .................. H04M 1/0249
361/679.56
(Continued)

FOREIGN PATENT DOCUMENTS

| EP | 2945352 | 11/2015 |
|----|---------|---------|
| EP | 3089008 | 11/2016 |
| WO | 2015106183 | 7/2015 |

OTHER PUBLICATIONS

U.S. Appl. No. 15/673,257, Notice of Allowance dated Feb. 7, 2019, 9 pages.
(Continued)

*Primary Examiner* — Jonathan M Blancha
(74) *Attorney, Agent, or Firm* — Lee, Hong, Degerman, Kang & Waimey PC

(57) ABSTRACT

The present invention provides an electronic device, including a window defining an outer surface of a main body, and having a pressure touch receiving area for receiving a pressure touch input, a metal case supporting the window and defining the outer surface of the main body, an organic light emitting diode (OLED) display module disposed beneath the window and configured to output visual information through the window, a metal support frame supporting the OLED display module, a guide frame supporting the OLED display module, and coupled to the window, and a pressure touch sensing unit disposed beneath the window and configured to detect a touch input applied to the window.

17 Claims, 23 Drawing Sheets

(51) Int. Cl.
 *G06F 1/16*    (2006.01)
 *G06F 1/20*    (2006.01)
 *G06F 3/041*    (2006.01)
 *G02F 1/1333*   (2006.01)
 *G06F 3/044*    (2006.01)
 *H01L 51/52*    (2006.01)

(52) U.S. Cl.
 CPC ............ *G06F 1/1643* (2013.01); *G06F 1/203* (2013.01); *G06F 3/044* (2013.01); *G06F 3/0412* (2013.01); *G06F 3/0414* (2013.01); *H01L 51/5237* (2013.01); *G06F 2203/04105* (2013.01)

(58) Field of Classification Search
 USPC ........................................................ 345/174
 See application file for complete search history.

(56) References Cited

U.S. PATENT DOCUMENTS

| | | | | |
|---|---|---|---|---|
| 2010/0085326 | A1* | 4/2010 | Anno | G06F 3/044 345/174 |
| 2010/0244005 | A1 | 9/2010 | Gyoda | |
| 2011/0074684 | A1 | 3/2011 | Abraham et al. | |
| 2013/0103123 | A1* | 4/2013 | Khan | A61N 5/0624 607/90 |
| 2013/0277094 | A1* | 10/2013 | Lee | H05K 3/361 174/254 |
| 2014/0062916 | A1* | 3/2014 | Hong | G06F 3/041 345/173 |
| 2014/0340609 | A1* | 11/2014 | Taylor | G02F 1/133308 349/58 |
| 2015/0205334 | A1 | 7/2015 | Chuang et al. | |
| 2016/0027851 | A1* | 1/2016 | Yanagisawa | H01L 27/3244 257/43 |
| 2016/0103542 | A1* | 4/2016 | Ogata | G06F 1/1643 345/174 |
| 2016/0103543 | A1* | 4/2016 | Kessler | G06F 3/0414 345/174 |
| 2016/0162093 | A1 | 6/2016 | Kim et al. | |
| 2016/0186944 | A1* | 6/2016 | Park | G09F 13/00 362/97.1 |
| 2017/0020032 | A1 | 1/2017 | Wang et al. | |
| 2017/0212630 | A1* | 7/2017 | Nakase | G06F 3/0416 |
| 2018/0286924 | A1 | 10/2018 | Lee et al. | |

OTHER PUBLICATIONS

U.S. Appl. No. 15/673,257, Office Action dated Oct. 9, 2018, 21 pages.

European Patent Office Application Serial No. 17196110.5, Search Report dated Apr. 10, 2018, 12 pages.

* cited by examiner

141f'  141f (a)

(b)

(c)

(d)

(e)

ELECTRONIC DEVICE WITH TOUCH SENSOR

CROSS-REFERENCE TO RELATED APPLICATION

This application is a continuation of U.S. patent application Ser. No. 15/673,257, filed on Aug. 9, 2017, now U.S. Pat. No. 10,355,059, which claims the benefit of earlier filing date of and right of priority to Korean Application No. 10-2017-0040991, filed on Mar. 30, 2017, the contents of which are all hereby incorporated by reference herein in their entirety.

BACKGROUND OF THE INVENTION

1. Field of the Invention

The present invention relates to an electronic device having a touch sensor receiving a touch input.

2. Background of the Invention

Terminals may be divided into mobile/portable devices and stationary devices according to mobility. Also, the mobile devices may be classified into handheld types and vehicle mount types according to whether or not a user can directly carry.

As it becomes multifunctional, a mobile terminal can be allowed to capture still images or moving images, play music or video files, play games, receive broadcast and the like, so as to be implemented as an integrated multimedia player. Many efforts include not only changes and improvement of structural components implementing a terminal but also software improvement to support and improve functions of the terminal.

In recent years, with development of various functions of an electronic device such as a mobile terminal, functions of scanning a finger and sensing a pressure touch are additionally provided, but a heat-dissipation structure and a water-proofing structure increase a thickness of the electronic device.

SUMMARY OF THE INVENTION

Therefore, to obviate the aforementioned problems and other drawbacks, an aspect of the detailed description is to provide an electronic device having a compact structure including an organic light emitting diode (OLED) display unit, a pressure touch sensing layer and a heat dissipation member.

To achieve these and other advantages and in accordance with the purpose of this specification, as embodied and broadly described herein, there is provided an electronic device, including a window defining an outer surface of a main body, and having a pressure touch receiving area for receiving a pressure touch input, a metal case supporting the window and defining the outer surface of the main body, an organic light emitting diode (OLED) display module disposed beneath the window and configured to output visual information through the window, a metal support frame supporting the OLED display module, a guide frame supporting the OLED display module, and coupled to the window, and a pressure touch sensing unit disposed beneath the window and configured to detect a touch input applied to the window.

In one embodiment disclosed herein, the pressure touch sensing unit may include a first base substrate having a first electrode layer provided with a plurality of electrode lines on one surface thereof, a second base substrate having a second electrode layer provided with a plurality of electrode lines on one surface thereof, a deformation layer disposed on the first and second electrode layers, a first heat dissipation member disposed on another surface of the first base substrate and configured to diffuse heat generated, a second heat dissipation member disposed on another surface of the second base substrate and configured to diffuse heat generated, and a circuit board electrically connected to the first and second electrode layers to detect a change in capacitance between the electrode lines of one of the first electrode layer and the second electrode layer. The first base substrate may be deformed with respect to the second based substrate, in response to a pressure touch applied to the window. The second base substrate may be fixed only to the deformation layer and the first base substrate. The first base substrate may be attached only on the display module.

According to the present invention, a pressure touch sensing layer and a heat dissipation structure may be provided, and a heat dissipation member and a display module can be stably fixed by a guide frame, which may result in enhancing durability while maintaining a heat dissipation effect.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Electronic devices presented herein may include cellular phones, smart phones, laptop computers, digital broadcast terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signage, and the like.

Figure 1A:
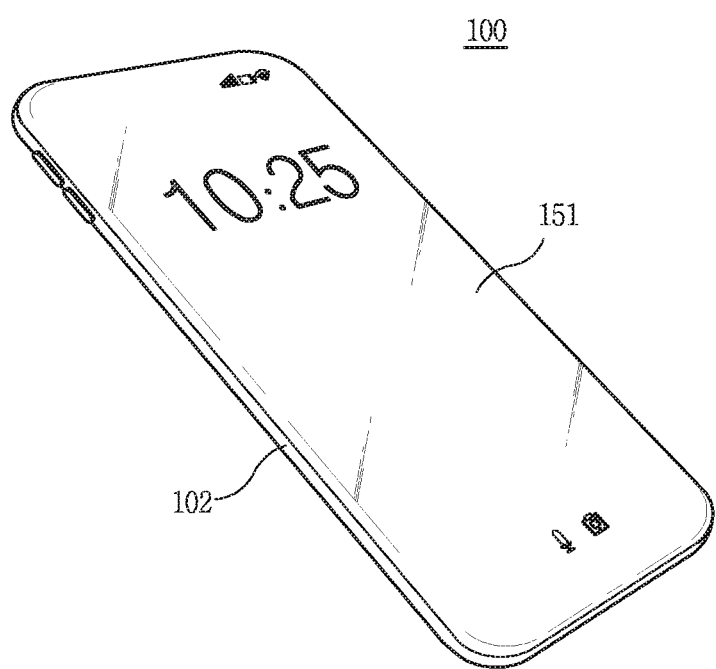
FIG. 1A is a conceptual view of an electronic device in accordance with one embodiment of the present invention, viewed from one direction.

FIG. 1A is a conceptual view of an electronic device in accordance with one embodiment of the present invention, viewed from one direction.

Referring to FIG. 1A, an electronic device 100 according to the present embodiment includes a bar-like terminal body. The electronic device 100 includes a case (for example, a housing, a frame, a cover, and the like) that defines appearance thereof.

A display unit 151 is disposed on a front surface of the electronic device 100. The display unit 151 may include a window, a display module, a touch sensor, and the like. The window defines the appearance of the electronic device 100.

The electronic device 100 may include a case 101 forming side surfaces and a rear surface. Various electronic components are disposed in an inner space formed by the display unit 151 and the case 101. At least one support frame for supporting the electronic components may be disposed inside the case 101.

Although not illustrated specifically, the electronic device 100 includes a frame coupled to the case 102 while supporting the display unit 151. A first assembly of the electronic device may include the frame and the display unit 151, and a second assembly may be defined by the case 101 and the electronic components mounted within the inner space.

The window or the window and the display module according to this embodiment may have curved edges.

The display module displays (outputs) information processed in the electronic device 100. For example, the display module may display execution screen information of an application program driven in the electronic device 100, or UI (User Interface) and GUI (Graphic User Interface) information according to the execution screen information.

The display module may include at least one of a liquid crystal display (LCD), a thin film transistor liquid crystal display (TFT LCD), an organic light-emitting diode (OLED), a flexible display, a three-dimensional display (3D display), and an electronic ink display (e-ink display).

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be designated.

On the other hand, the touch sensor may be configured in a form of a film having a touch pattern and disposed between a window and a display (not illustrated) on a rear surface of the window, or may be a metal wire directly patterned on the rear surface of the window. Alternatively, the touch sensor may be formed integrally with the display. For example, the touch sensor may be disposed on a substrate of the display, or may be provided within the display.

In this way, the display unit 151 may form a touch screen together with the touch sensor, and in this case, the touch screen may function as a user input unit.

The window defining appearance of a front surface of the electronic device 100 is formed to cover an entire area of the front surface. That is, the case 101 is bonded along edges of the window to form a main body, and the window 101 is formed to cover the inner space formed by the case 101. In addition, since the window is not provided with a specific hole, an electronic component such as a button portion is not formed on the front surface of the electronic device 100.

Alternatively, the window may include an audio output module for outputting sound and a hole for arranging a camera.

The electronic device 100 according to this embodiment is not provided with the user input unit, such as the button portion, on the front surface thereof, and thus a graphic image or the like for performing the same function as a function of the button portion may be output on one area of the display unit 151.

Figure 1B:
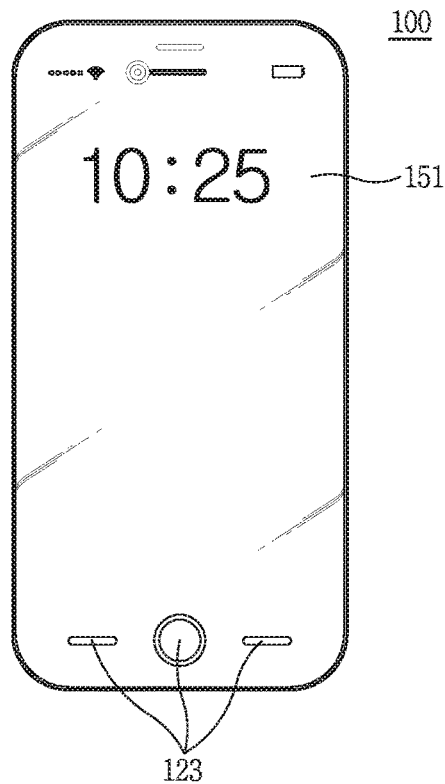
FIGS. 1B and 1C are conceptual views of an electronic device in accordance with another embodiment of the present invention, viewed from different directions.
Figure 1C:
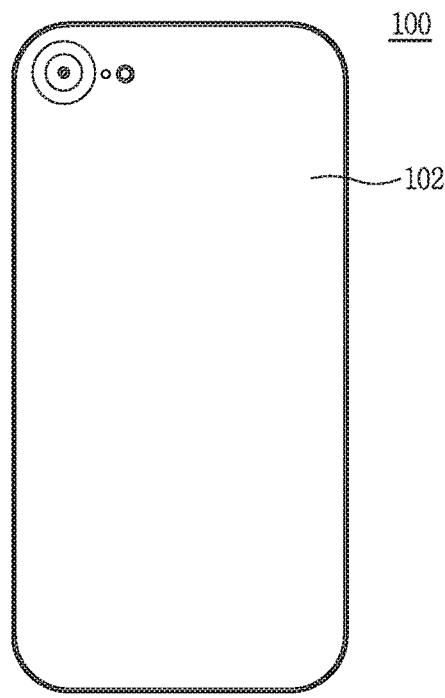

FIGS. 1B and 1C are conceptual views of an electronic device according to another embodiment, viewed from different directions.

Referring to FIGS. 1B and 1C, the electronic device 100 includes a display unit 151 disposed on a front surface thereof and including a window, a display module, and a touch sensor, and a case 102 disposed on a rear surface thereof. The electronic device 100 according to the another embodiment may be configured by first and second assemblies of FIG. 1A, and a redundant description will be omitted.

Meanwhile, the display unit 151 includes a user input unit 123 formed beneath the window. For example, the user input unit 123 may configure an area for receiving a touch input. The user input unit 123 may be implemented by light output from the display module or implemented as a metal portion displayed on the display module or the window.

Alternatively, at least one of the user input units 123 may be a button portion which penetrates through the window to define an appearance. The button portion includes a push module, and the push module may be mounted to be inserted through a through hole of the window.

Hereinafter, components of the electronic device 100 according to various embodiments of the present invention will be described with reference to the exploded views.

Figure 2A:
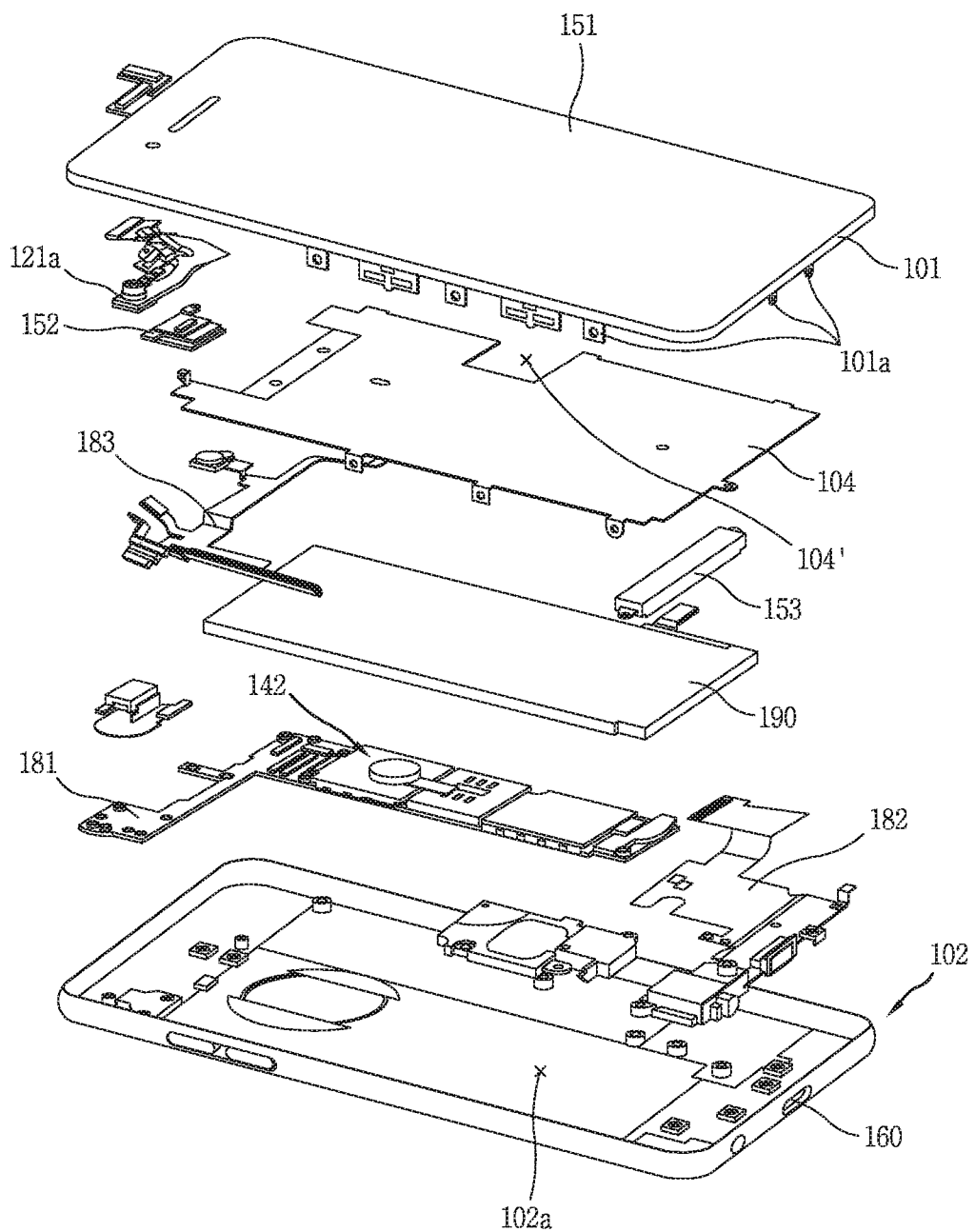
FIGS. 2A and 2B are exploded views of electronic devices in accordance with different embodiments of the present invention.
Figure 2B:
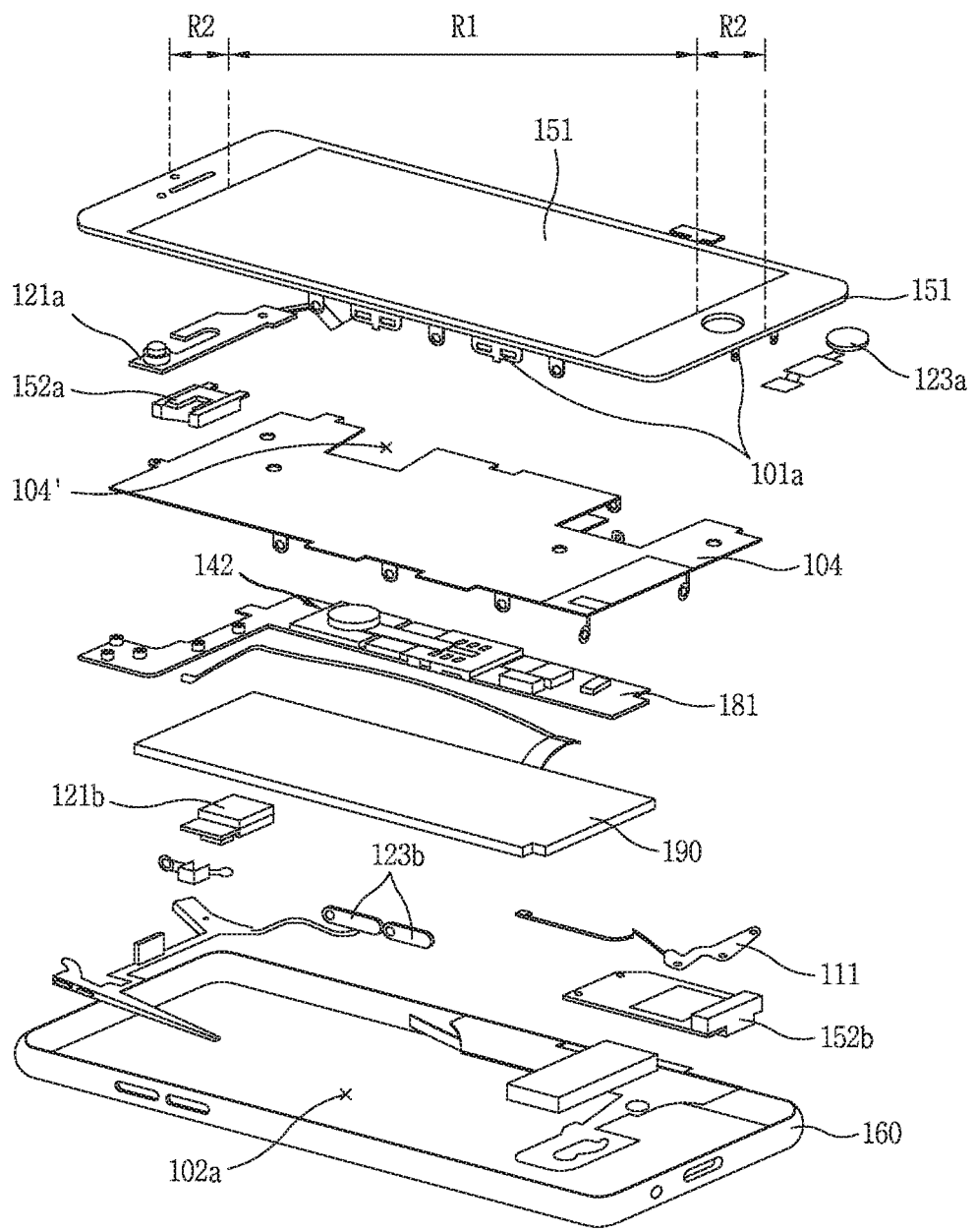

FIGS. 2A and 2B are exploded views of electronic devices according to different embodiments of the present invention.

Referring to FIG. 2A, a first assembly of the electronic device 100 includes a display unit 151 and a support frame 101. The second assembly includes a case 102 having an inner space 102', a metal support unit 104, first to third circuit boards 181, 182 and 183, and a plurality of electronic components.

The support frame 101 is coupled to the metal support unit 104 and the case 102 while supporting the display unit 151.

The display unit 151 according to this embodiment includes a window, a display module, and a touch sensor. Although not illustrated, the display unit 151 may include a pressure touch sensing layer for sensing a pressure touch having pressure stronger than or equal to a predetermined reference pressure.

In addition, the second assembly may include a heat dissipation unit for externally dissipating heat generated in the electronic device 100. For example, the heat dissipation unit may be made of at least one of a graphite sheet, a PU sheet, and a metal plate.

The support frame 101 includes coupling protrusions 101a protruding from one surface thereof supporting the display unit 151 to couple the support frame 101 to the metal support unit 104 and the case 102. The window is disposed to cover a front surface of the display unit and the support frame 101 supporting the display unit. The electronic device 100 according to this embodiment does not include a button portion arranged to be inserted through the window.

The second assembly includes first and second cameras 121a and 121b accommodated in the inner space 102a, an audio output module 152, a haptic module 153, the first to third circuit boards 181, 182 and 183, a power supply unit 190 for supplying power, a finger scan module 140, and a metal support unit 104.

The second camera 121b has a capturing direction which is substantially opposite to that of the first camera 121a. The second camera 121b may include a plurality of lenses arranged along at least one line. The plurality of lenses may be arranged in a matrix form. Such a camera may be named an 'array camera'. When the second camera 121b is configured as an array camera, images may be taken in various ways using the plurality of lenses, and a better quality image can be obtained.

The audio output module 152 may be implemented in a form of a receiver for delivering a call sound to a user's ear or a loud speaker for outputting various alarm sounds or multimedia playback sounds.

The window may be provided with sound holes for emitting sounds generated from the audio output module 152. However, the present invention is not limited thereto, and the sounds may be emitted along an assembly gap between structures. In this case, the holes formed independently for outputting the sounds are invisible or hidden, so that the appearance of the electronic device 100 can be more simplified.

The haptic module 153 outputs vibration based on a specific control command and the user may sense the vibration generated in the haptic module 153 through the display unit 151, the case 101 and the like.

The power supply unit 190 may include a battery that is disposed within the terminal body or detachably coupled to an outside of the terminal body. The battery may receive power through a power cable connected to the interface unit 160. The battery may also be configured to be wirelessly chargeable through a wireless charger. The wireless charging may be implemented by a magnetic induction method or a resonance method (magnetic resonance method).

The metal support unit 104 is disposed to cover a remaining area of the inner space 102a except for the finger scan module 104.

The power supply unit 190 is disposed in one area of the inner space 102a and the first to third circuit boards 181, 182, and 183 are disposed on the remaining area. A plurality of electronic components are disposed on the first to third circuit boards 181, 182, and 183.

The finger scan module 140 is mounted on the first circuit board 181. The finger scan module 140 does not overlap the power supply unit 190. The metal support unit 104 includes an opening area 104' corresponding to one area where the finger scan module 140 is disposed. The opening area 104' may be in a form of being recessed from a specific edge.

The finger scan module 140 is exposed from the metal frame 104 through the opening area 104' and disposed adjacent to one area of the display unit 151. Accordingly, fingerprint information related to a finger touching the window may be detected.

The electronic device 100 includes first to fourth side surfaces. The first and second side surfaces are opposed to each other and the third and fourth side surfaces are opposed to each other. The first camera 121a and the audio output module 152 may be disposed adjacent to the first side surface and the interface unit 160 may be disposed on the second side surface.

Meanwhile, the finger scan module 140 may be disposed adjacent to a part of the third and fourth side surfaces. Accordingly, the user can perform a specific function by sensing a fingerprint through the finger scan module 140 while holding the electronic device 100 in a hand.

The electronic device 100 according to FIG. 2B includes the first assembly having the display unit 151, a first user input 123a, the support frame 101, and the second assembly having the case 102 including the inner space 102a, the metal frame 104, and a plurality of electronic components disposed in the inner space 102a.

The first assembly includes the first user input 123a disposed through the window. The display module includes an output area R1 for outputting an image and a peripheral area R2 of the output area R1. The first user input unit 123a is disposed in the peripheral area R2.

The first assembly may further include a first camera 121a and a first audio output unit 152a disposed on the front surface of the electronic device 100. Also, the electronic components included in the first assembly may not be limited thereto. Although not illustrated, the first assembly may further include a pressure touch sensing layer for sensing a pressure touch over reference pressure.

In addition, the second assembly may include a heat dissipation unit for externally dissipating (radiating) heat generated in the electronic device 100. For example, the heat dissipation unit may be made of at least one of a graphite sheet, a PU sheet, and a metal plate.

Meanwhile, the second assembly includes the power supply unit 190 disposed in one area of the inner space 102a, and the first circuit board 181 disposed in the remaining area. An antenna unit 111, a second audio output module 152b, a second camera 121b, and the like may be mounted on the first circuit board 181. In addition, the second user input unit 123b may be disposed on one side surface by the case 102.

In addition, the finger scan module 140 is disposed in one area of the first circuit board 181. For example, the finger scan module 140 may be disposed adjacent to an edge of the electronic device 100 which is formed by the case 102 and the display unit 151.

The inner space 102a is covered with the metal frame 104. The metal frame 104 includes an opening area 104' through which the finger scan module 140 is disposed adjacent to the display part 151. Accordingly, the finger scan module 140 is not covered with the metal frame 104.

The electronic device 100 includes first to fourth side surfaces. The first and second side surfaces are opposed to each other and the third and fourth side surfaces are opposed to each other. The first camera 121a and the audio output module 152 may be disposed adjacent to the first side surface and the interface unit 160 may be disposed on the second side surface.

Meanwhile, the finger scan module 140 may be disposed adjacent to a part of the third and fourth side surfaces. Accordingly, the user can perform a specific function by sensing a fingerprint through the finger scan module 140 while holding the electronic device 100 in a hand.

Figure 3A:
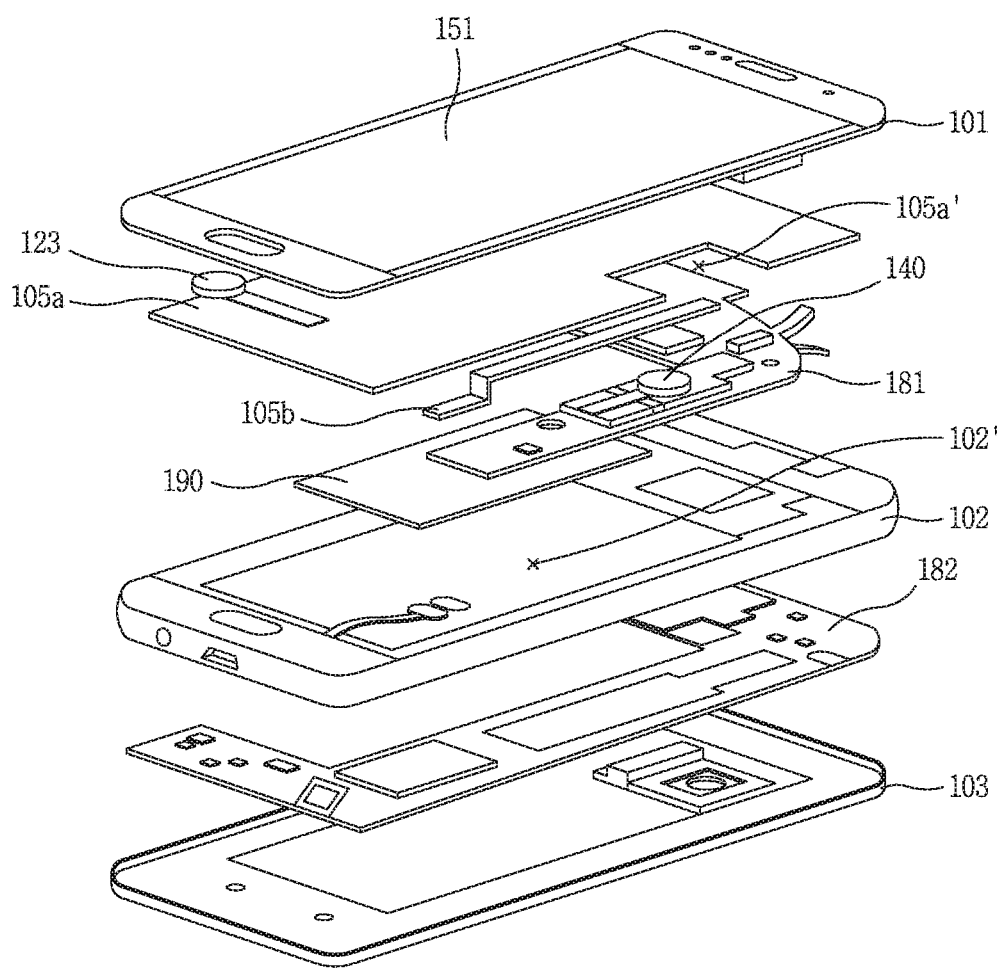
FIGS. 3A and 3B are exploded views of electronic devices in accordance with different embodiments.
Figure 3B:
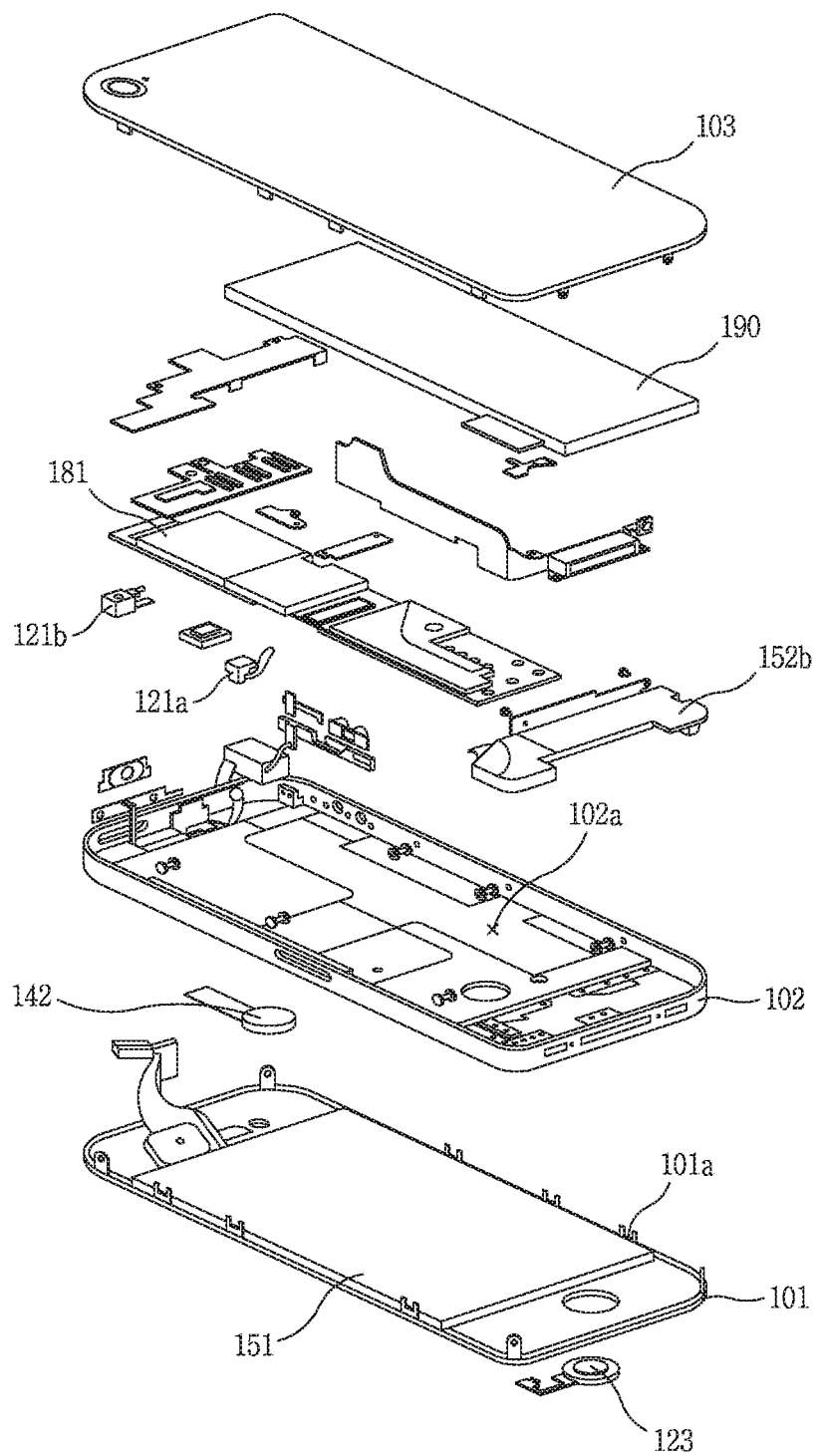

FIGS. 3A and 3B are exploded views of electronic devices according to different embodiments.

Referring to FIG. 3A, the electronic device 100 includes a first assembly having a display unit 151 and a support frame 101, a second assembly having a case 102 provided with an inner space 102a, a first circuit board 181 and a power supply unit 190, and a rear cover 103 attached to the case 102 to form a rear appearance of the electronic device 100.

Positions of electronic components disposed in the case 102 and the remaining components, except for the rear cover 103 and the first and second heat dissipation members 105a and 05b, are substantially the same as the components of FIG. 2B, and thus a redundant description is omitted.

The case 102 includes the inner space 102a formed with both surfaces. For example, the first circuit board 181 may be disposed on one surface facing the display unit 151, and a second circuit board 182 and the power supply unit 190 may be disposed on an opposite surface facing the rear cover 103.

The power supply unit 190 according to this embodiment may be disposed on a rear surface of the case 102 so as to be covered with the rear cover 103. In this case, the power supply unit 190 may be detachably mounted to the case 102.

A finger scan module 140 is disposed on the first circuit board 181.

A first heat dissipation member 105a is disposed between the first circuit board 181 and the display unit 151. The first heat dissipation member 105a is formed in a film or plate shape corresponding to the display part 151. The first heat dissipation member 105a may be made of a PU sheet, a graphite sheet, a metal layer, or the like.

The first heat dissipation member 105a includes an opening area 105a' through which the finger scan module 140 is disposed adjacent to the display unit 151. The finger scan module 140 may be disposed adjacent to the display module through the opening area 105a', to detect a fingerprint of a finger touching the window.

In addition, the second heat dissipation member 105b may have a shape extending in one direction to be brought into contact with a thermal conductive material. The second heat dissipation member 105b may allow for dissipation of heat which is generated in a specific area where much heat is generated.

The first assembly may further include a first camera 121a and a first audio output module 152a disposed on a front surface of the electronic device 100. Also, the electronic components included in the first assembly may not be limited thereto. Although not illustrated, the first assembly may further include a pressure touch sensing layer for sensing a pressure touch over reference pressure.

The electronic device 100 according to FIG. 3B includes a first assembly having a support frame 101 and a display unit, a second assembly having a case 102, a first circuit substrate 181 and a power supply 190, and a rear cover 103.

The components of the electronic device 100 according to this embodiment are substantially the same as the components of the electronic device 100 of FIG. 2A except for the position of the inner space of the case 102 and the rear cover 103, and thus a redundant description will be omitted.

The inner space of the case 102 is formed to face the rear cover 103. That is, the first assembly is mounted on one surface of the case 102. A finger scan module 140 may be disposed between the case 102 and the display unit 151. Although not illustrated, the case 102 may include an accommodating groove for accommodating and supporting the finger scan module 140.

First and second cameras 121a and 121b, first and second audio output modules 152a and 152b, a first circuit board 181, and a power supply unit 190 are disposed in the inner space of the case 102.

The rear cover 103 is mounted on the case 102 so as to cover the inner space 102a. According to one embodiment, the case 102 and the rear cover 103 may be fixed so as not to be separated from each other. That is, the electronic device 100 may have an integral body from which the power supply unit 190 is not detached.

The first assembly may further include the first camera 121a and the first audio output module 152a disposed on a front surface of the electronic device 100. Also, the electronic components included in the first assembly may not be limited thereto. Although not illustrated, the first assembly may further include a pressure touch sensing layer for sensing a pressure touch over reference pressure.

In addition, the second assembly may include a heat dissipation unit for externally dissipating heat generated in the electronic device 100. For example, the heat dissipation unit may be made of at least one of a graphite sheet, a PU sheet, and a metal plate.

The electronic device according to the present invention includes the pressure touch sensing layer for sensing a pressure touch input, the finger scan module, and the heat dissipation unit. In addition, the user input unit inserted through the window is removed, and thus a specific function can be performed using the finger scan module.

The finger scan module is disposed adjacent to the display unit through the pressure touch sensing layer and the heat dissipation unit. Hereinafter, the structure of the finger scan module will be described.

Figure 4A:
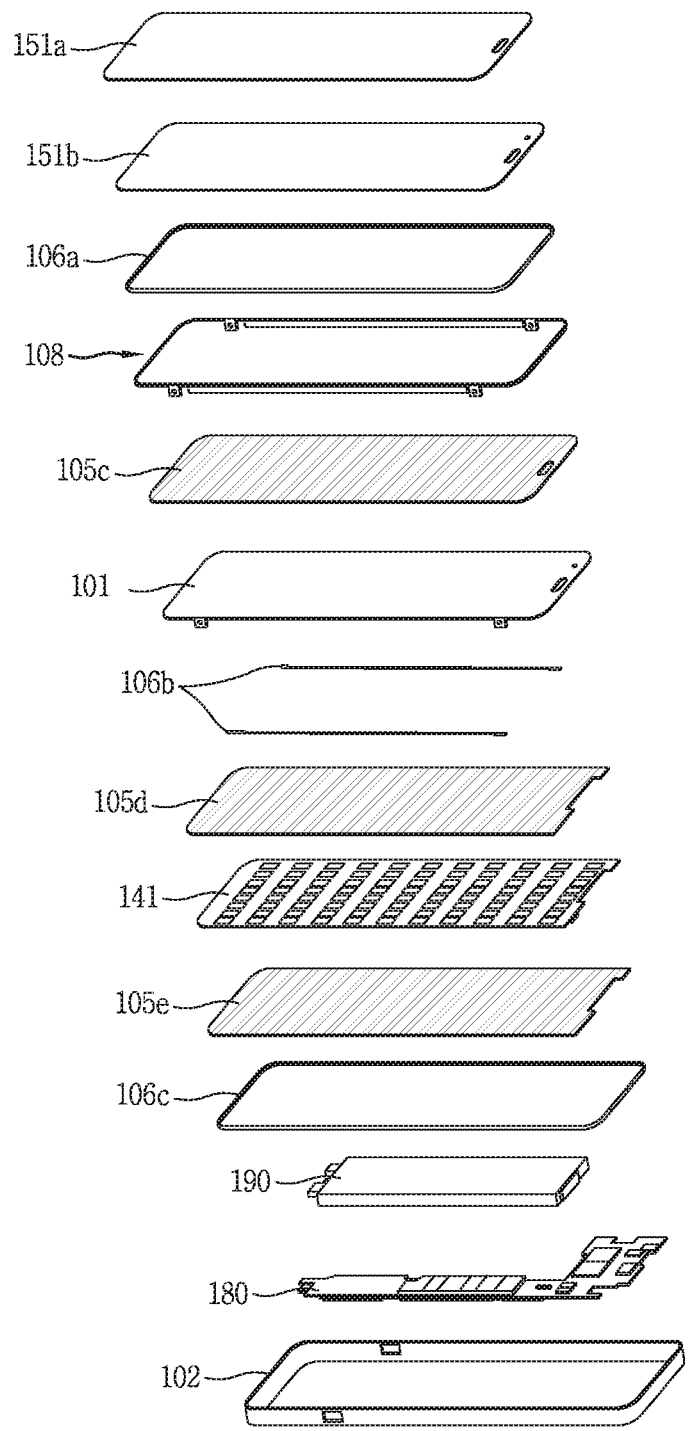
FIGS. 4A and 4B are exploded views of electronic devices in accordance with embodiments of the present invention.
Figure 4B:
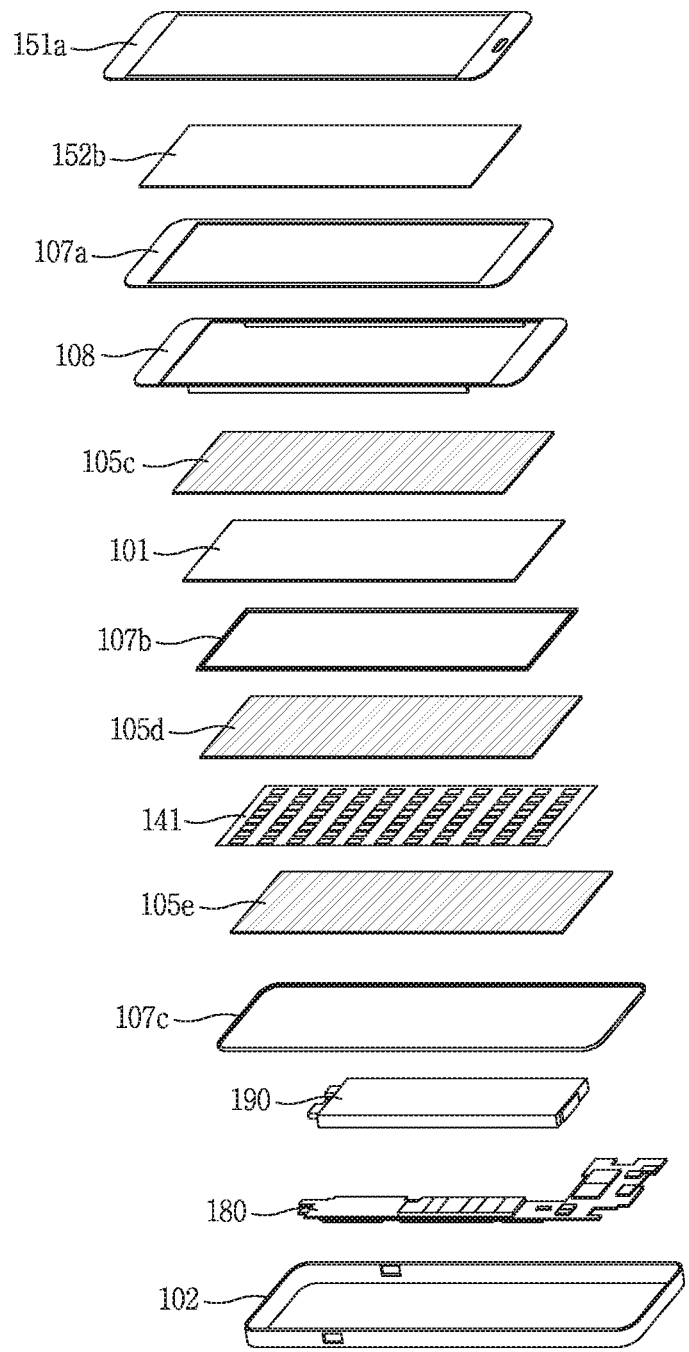

FIGS. 4A and 4B are exploded views of electronic devices in accordance with embodiments of the present invention.

Referring to FIG. 4A, the electronic device 100 includes a display unit 151 having a window 151a and a display module 151b, first and second waterproof members 106a and 106b, a guide frame for fixing the display module 151b, a support frame 101, a third waterproof member 106c, first and second graphite sheets 105c, 105d and 105e, a pressure touch sensing layer 141, a finger scan module 142, a power supply unit 190, a circuit board 180, and a case 102.

The window 151a may further include a touch sensor for receiving a touch input. The display module 151a may be implemented as an OLED display module.

The case 102 has an inner space, in which the circuit board 180 and the power supply unit 190 are disposed. The power supply unit 190 is preferably disposed on one area of the inner space and the circuit board 180 on a remaining area so that the power supply unit 190 and the circuit board 180 are accommodated so as not to overlap each other.

The guide frame 108 is provided along edges of the display module 151b. The guide frame 108 and the support frame 101 are coupled to each other. The guide frame 108 includes a mold portion 108a formed of a mold member and a metal portion 108b disposed on an inner circumferential surface of the mold portion 108a. The metal portion 108b is formed in an area adjacent to the third side surface.

After the display module 151b, the first graphite sheet 105c, the support frame 101, the second graphite sheet 105d and the pressure touch sensing layer 141 are sequentially laminated on one another, the guide frame 108 surrounds side surfaces of the laminated layers. The window 151a is disposed on the display module 151b fixed by the guide frame 108.

The window 151a is bonded to the guide frame 106 by the first waterproof member 106a. Accordingly, an introduction of water between the window 151a and the guide frame 106 can be prevented.

Meanwhile, the second waterproof member 106b is attached between the guide frame 108 and the case 102. By virtue of the second waterproof member 106b, the display unit 151, the pressure touch sensing layer 142 and the heat dissipation structure can be fixed to the case 102, and an introduction of water into the case 102 can be prevented.

The third waterproof member 106c is formed to correspond to the metal portion 108b and adheres the support frame 101 to the metal portion 108a.

The window 151a according to the present invention is formed to cover an entire surface of the display module 151b, and thus the electronic device 100 according to the present invention does not have an input unit formed in a shape of a user pressing key on the front surface of the terminal body. Accordingly, each of the window 151a and the display module 151b includes a hole through which the audio output module and the camera are inserted.

The electronic device 100 according to FIG. 4B includes substantially the same components as the components of the electronic device 100 of FIG. 4A except for the display module 152b and the first to third waterproof members 107a, 107b and 107c. Thus, the same reference numerals are assigned to the same components, and thus a redundant description thereof will be omitted.

The window 151a includes a display area in which an image is displayed and a surrounding area. The display module 152b is disposed in the surrounding area of the window, and is smaller than the window 151a. Accordingly, an area of the first waterproof member 107a adhered to the window 151a can be increased.

Therefore, the window 151a is provided with a through hole through which the audio output module is inserted, but the display module 152b does not include any through hole.

The display module 152b is fixed by the guide frame 108. An edge area of the guide frame 108 is adhered to the surrounding area of the window 151a by the first waterproof member 107a. The display module 152b and the window 151a may be fixed by the guide frame 108 and the support frame 101.

The second waterproof member 107b is attached between the guide frame 108 and the case 102 to prevent an introduction of water between the case 102 and the guide frame 108.

The second waterproof member 107b is formed to correspond to the guide frame 108, and allows the support frame 101 to be adhered on the guide frame 108. Accordingly, the electronic device 100 according to this embodiment can be implemented to have a waterproof structure for preventing an introduction of water.

Figure 5A:
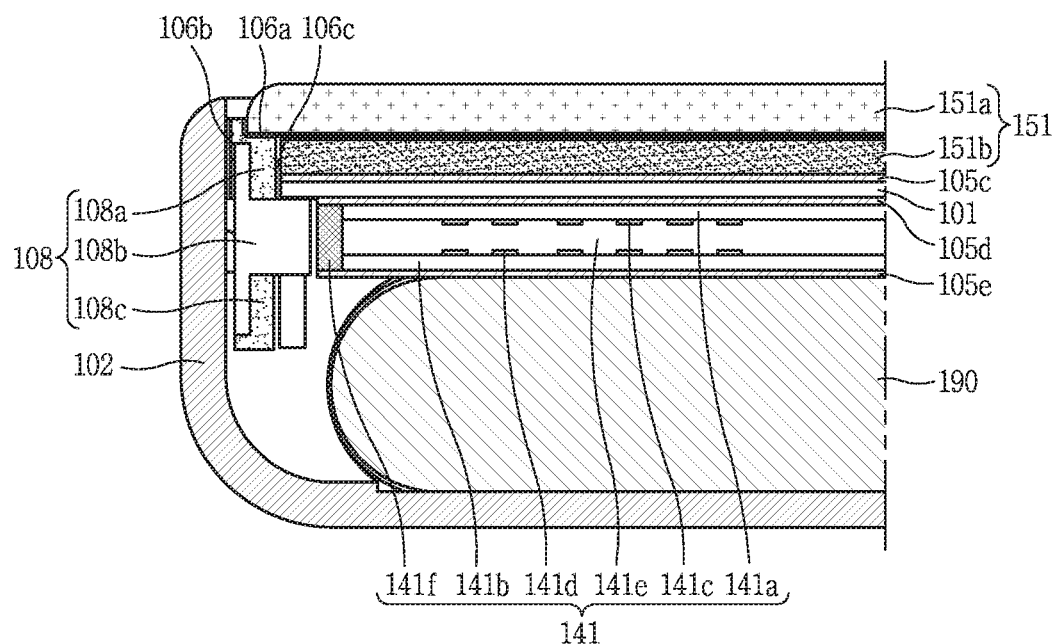
FIGS. 5A and 5B are cut-off partial sectional views of electronic devices in accordance with different embodiments.
Figure 5B:
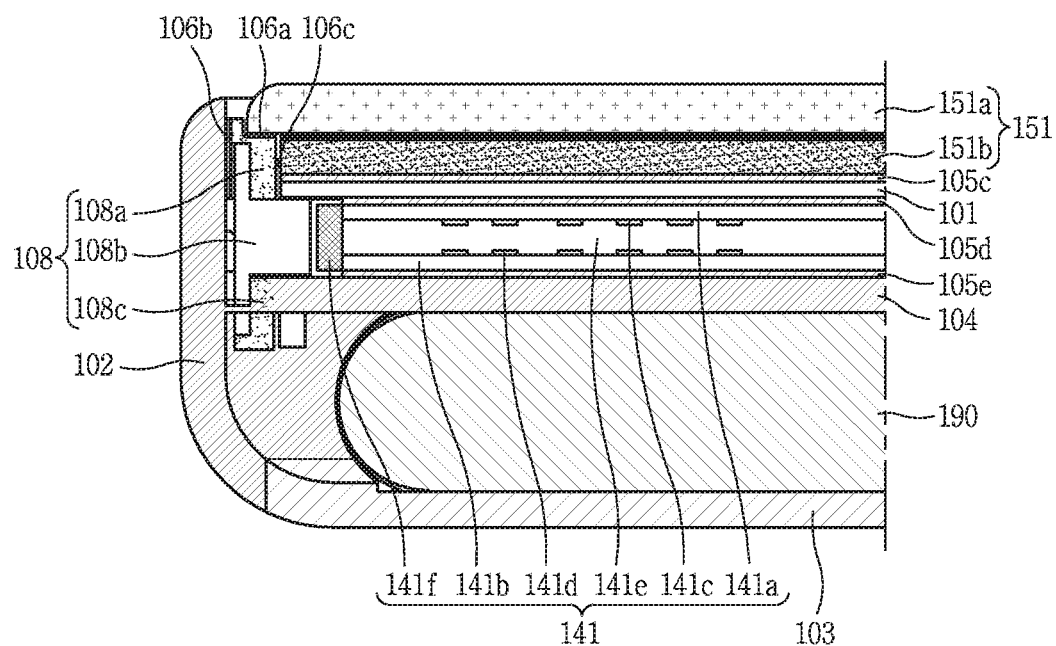
Figure 6A:
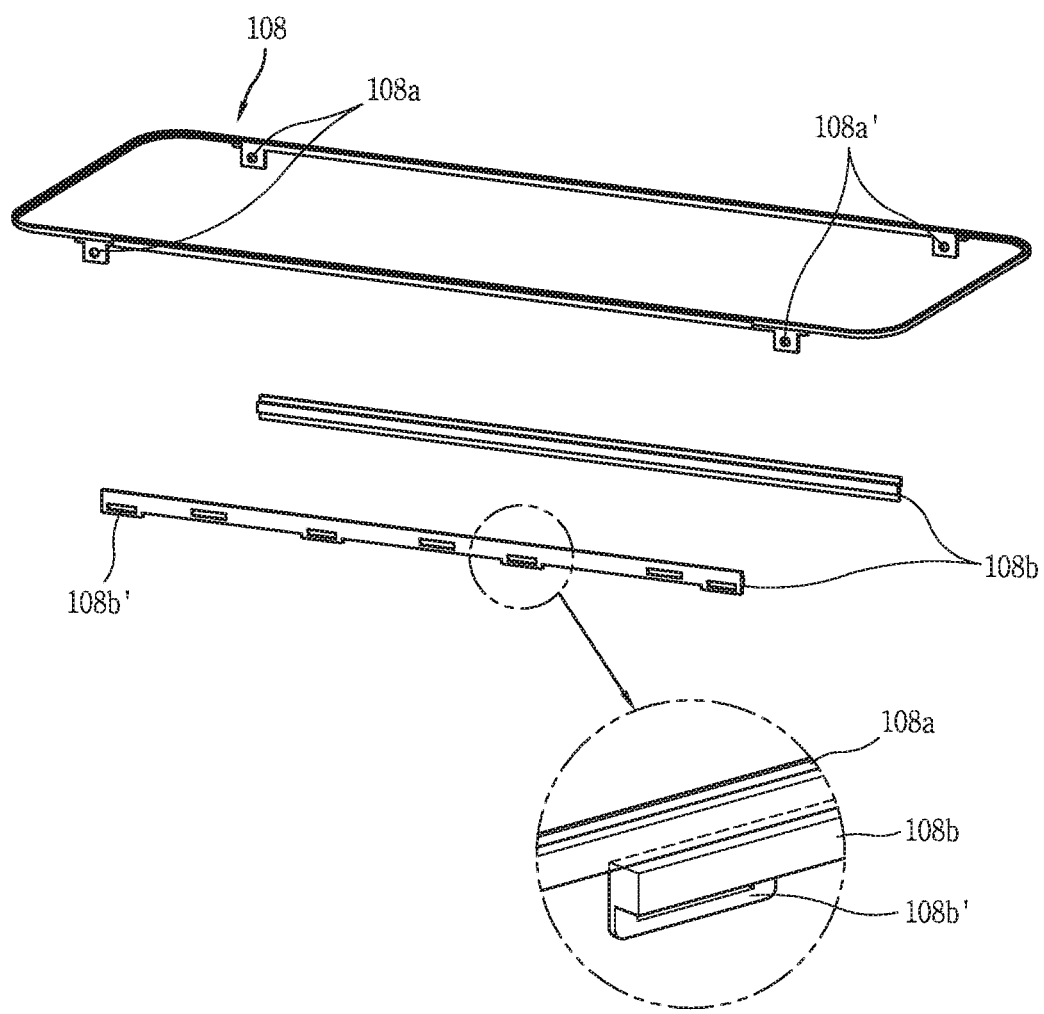
FIGS. 6A and 6B are views illustrating a structure of a guide frame.
Figure 6B:
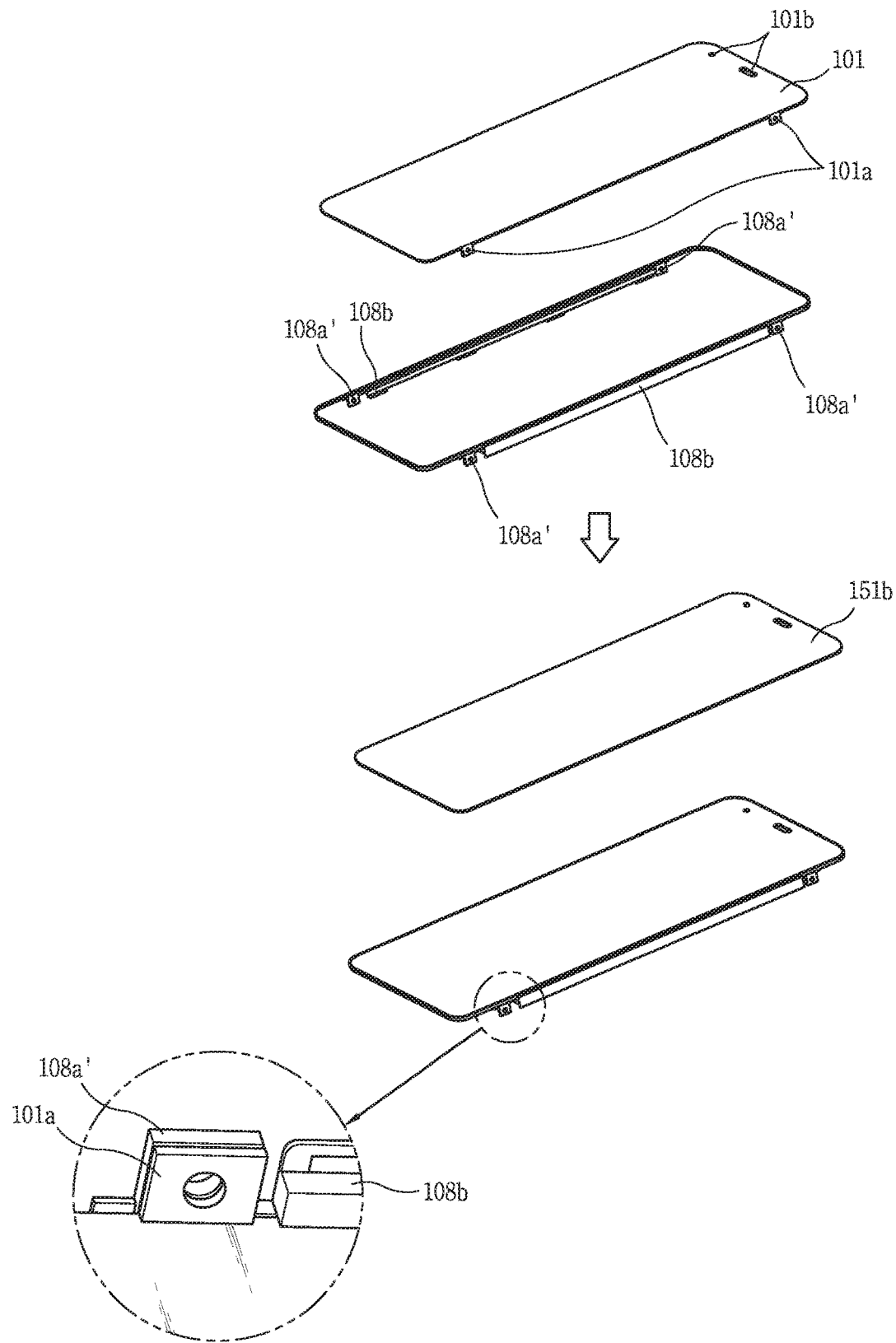
Figure 7A:
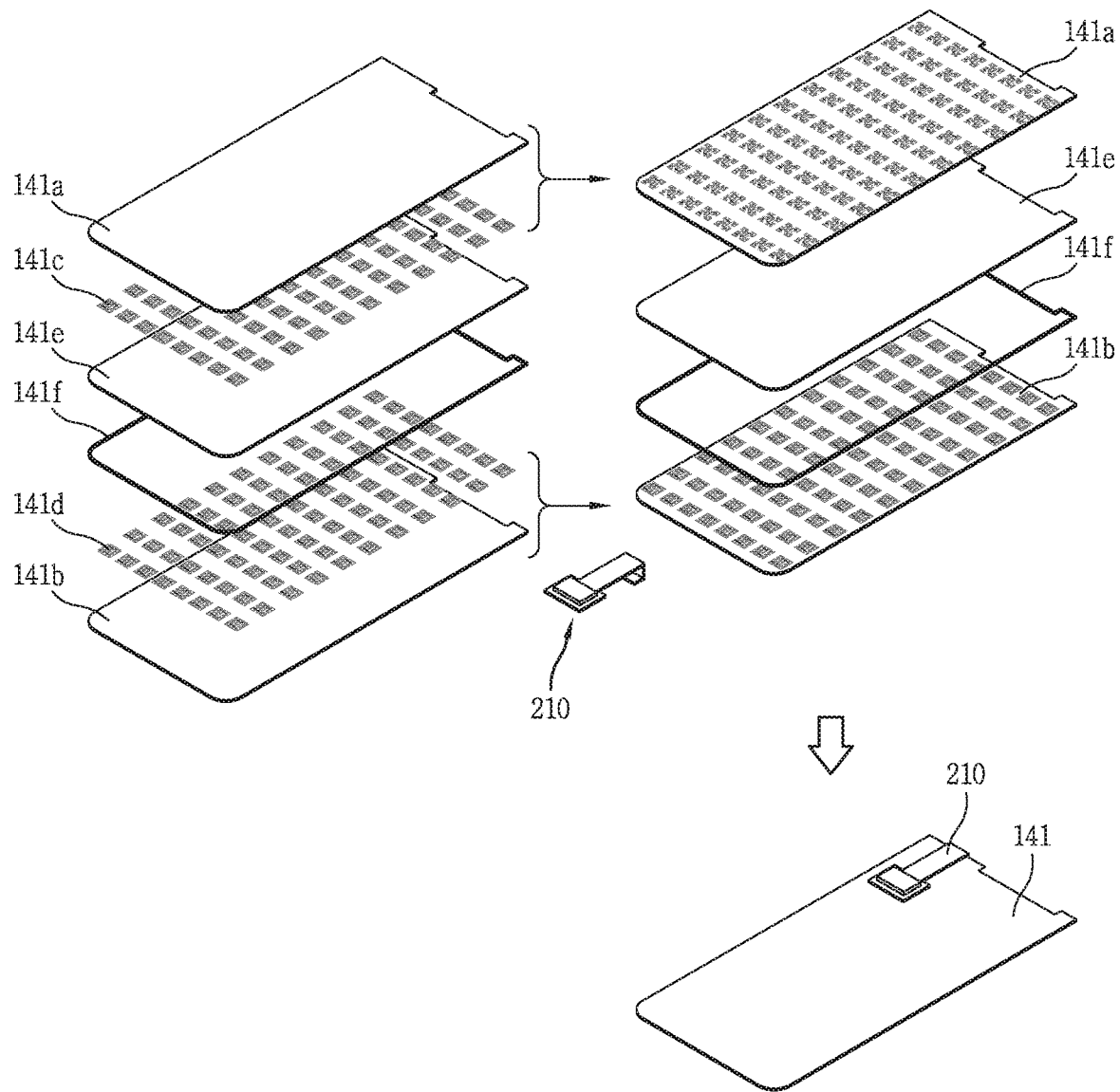
FIGS. 7A and 7B are views illustrating a pressure touch sensing layer.
Figure 7B:
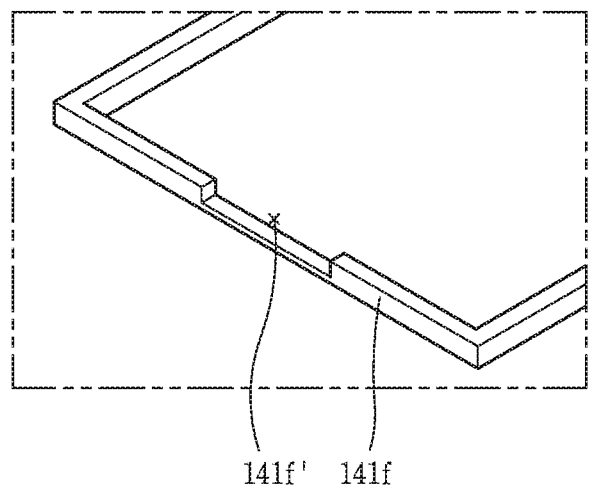

FIGS. 5A and 5B are cut-off partial sectional views of electronic devices according to different embodiments, FIGS. 6A and 6B are views illustrating a structure of a guide frame, and FIGS. 7A and 7B are views illustrating a pressure touch sensing layer.

Referring to FIG. 5A, the power supply unit 190 is disposed within the case 102, and the pressure touch sensing layer 141, the heat dissipation structure, and the display unit 151 are disposed on the power supply unit 190.

Referring to FIGS. 5A and 6A, the guide frame 108 includes a mold portion 108a formed along the edges of the display module 151b, and a metal portion 108b coupled to the mold portion 108a. The metal portion 108b is formed of a pair of metal members extending in one direction. The metal members are mounted on the mold portion 108a in parallel to each other.

The mold portion 108a includes a first coupling portion 108a' by which the mold portion 108a is coupled to the support frame 101. The first coupling portion 108a' is provided with a coupling hole. A coupling member fixed to the support frame 101 is inserted through the coupling hole to fix the support frame 101 and the mold portion 108a.

One edge of the metal portion 108b is fixed to the mold portion 108a and a coupling structure 108b' is formed on another edge. The coupling structure 108b' may be formed in a shape of a groove or a hole.

The mold portion 108b supports side surfaces of the display panel 151b and the metal portion 108b is disposed to support side surfaces of the pressure touch sensing layer 141. The first waterproof member 106a is attached between the metal portion 108b and the window 151a. The window 151a is fixed to the guide frame 108 by the first waterproof member 106a so as to be arranged adjacent to the display panel 151b. The second waterproof member 106b is attached to an outer circumferential surface of the guide frame 108. The guide frame 108 is attached to an inner surface of the case 102 by the second waterproof member 106b, so as to prevent a flow of water into an inner space formed by the guide frame 108 and the case 102.

Referring to FIGS. 5A and 6B, the support frame 101 has a shape corresponding to the display panel 151b. The support frame 101 may be disposed beneath the display panel 151b and provided with a through hole 101b through which at least one electronic component is inserted. In addition, the support frame 101 includes a second coupling portion 101a corresponding to the first coupling portion 108a'. The second coupling portion 101a protrudes from the support frame 101 and is provided with a coupling hole through which a coupling member can be inserted.

The support frame 101 is mounted within the mold portion 108a and the display module 151b and the window 151a are sequentially mounted on the support frame 101. The display module 151b and the window 151a are coupled to the guide frame 108 by a waterproof member.

The display module 151b, the window 151a and the support frame 101 may be stably arranged by the guide frame 108.

Meanwhile, the pressure touch sensing layer 141 is disposed in a space defined by the metal portion 108b and the mold portion 108a of the guide frame 108. A part of an edge of the pressure touch sensing layer 141 is supported by the metal portion 108b.

Referring to FIGS. 7A and 7B, the pressure touch sensing layer 141 includes first and second base substrates 141a and 141b, first and second electrode layers 141c and 141d, a deformation layer (polyethylene terephthalate (PET)) 141e, and a guide mold 141f.

The first electrode layer 141c is formed on one surface of the first base substrate 141a and another surface of the first base substrate 141a corresponds to a surface facing the support frame 101. The second electrode layer 141d is formed on one surface of the second base substrate 141b facing the first base substrate 141a. The deformation layer 141e is formed between the first and second base substrates 141a and 141b with the first and second electrode layers 141c and 141d formed thereon. The deformation layer 141e may be an insulating member.

The first and second base substrates 141a and 141b and the deformation layer 141e are fixed by the guide mold 141f. The patterns of the first and second electrode layers 141c and 141d may be precisely aligned by the guide mold 141f.

The first and second electrode layers 141c and 141d are electrically connected to a circuit board of the electronic device 100 by a flexible circuit board 210. Referring to FIG. 7B, a recess 141f may be formed on one area of the guide mold 141f so that the flexible circuit board 210 is disposed therein.

The recess 141f may allow the pressure touch sensing layer 141 to have a uniform thickness although the flexible circuit board 210 is folded from one surface to another.

Meanwhile, the components of the electronic device 100 of the embodiment according to FIG. 5B are substantially the same as the components of the electronic device 100 according to FIG. 5A except for the case 102, the rear cover 103 and the inner frame 104. Therefore, the same reference numerals are assigned to the same components, and a redundant description will be omitted.

The case 102 defines side surfaces of the electronic device 100 and is coupled to the rear cover 103. The rear cover 103 faces the display unit 151 and defines a rear surface of the electronic device 100. The rear cover 103 may be detachable from the case 102. In this case, the power supply unit 190 is detachable from the terminal body of the electronic device 100.

Meanwhile, the inner frame 104 may be disposed within the terminal body to support the pressure touch sensing layer 141, and may be formed integrally with the case 102. The pressure touch sensing layer 141 is formed on one surface of the inner frame 104 to support an external force applied on the window 151a. In addition, an accommodation area where the power supply unit 190 is disposed may be formed on another surface of the inner frame 104.

Figure 8A:
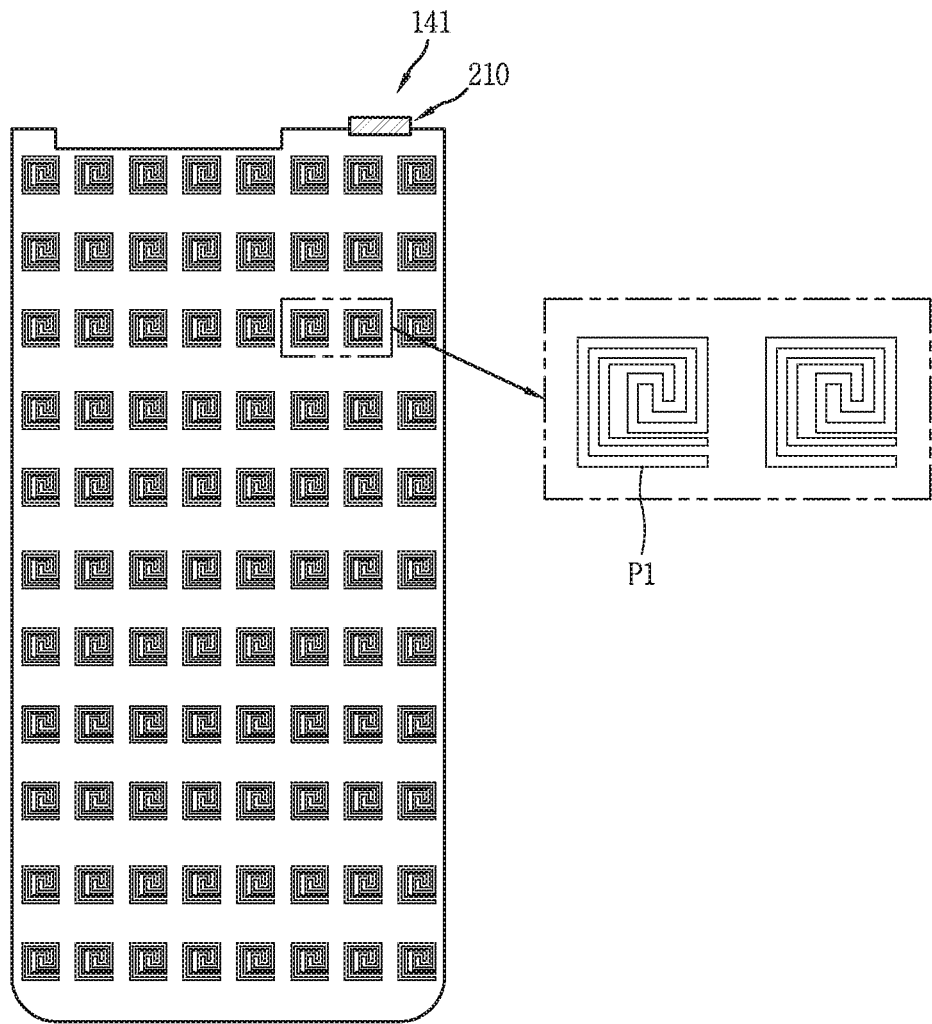
FIGS. 8A to 8C are conceptual views illustrating a pressure touch sensing layer in accordance with one embodiment.
Figure 8B:
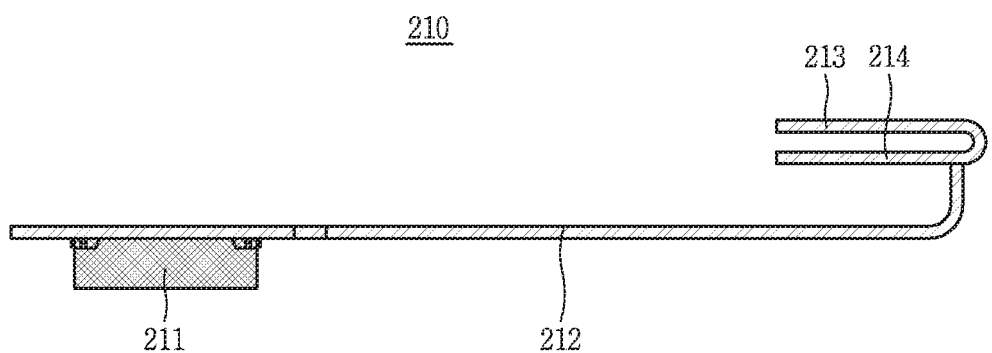
Figure 8C:
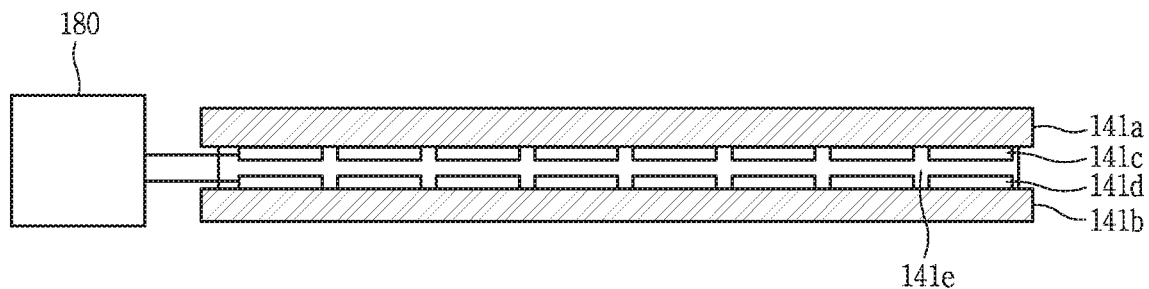

FIGS. 8A to 8C are conceptual views illustrating a pressure touch sensing layer according to one embodiment.

Referring to FIGS. 7A and 8A, a plurality of first conductive patterns P1 are formed on the first and second base substrates 141a and 141b. The plurality of first conductive patterns P1 may be regularly arranged at preset intervals.

The first conductive pattern P1 is made of a transparent conductive member, for example, ITO, PEDOT, or the like. The first conductive pattern P1 may have a shape that is wound around a central area, and electrodes may be formed at both ends of the first conductive pattern P1. The shape of the conductive patterns formed on the first and second base substrates 141a and 141b is not limited thereto.

Referring to FIGS. 8A to 8C, the first and second electrode portions 141c and 141d of the pressure touch sensing layer 141 are connected to the circuit board 180 by the flexible circuit board 210. The flexible circuit board 210 includes a connector 211 connected to the circuit board 180, first and second connection portions 213 and 214 connected to the first and second electrode layers 141c and 141d, respectively, and an extension portion 212 extending from the first and second connection portions 213 and 214 to the circuit board 180. The first and second connection portions 213 and 214 and the extension portion 212 are integrally formed with each other. The first and second connection portions 213 and 214 are spaced apart form each other so as to form a space therebetween, and the deformation portion 141e is inserted into the space. The first and second connection portions 213 and 214 may have substantially the same length.

The extension portion 212 extending from a center between the first and second connection portions 213 and 214 extends toward the rear surface of the pressure touch sensing layer 141, namely, toward the circuit board 180 while surrounding a part of the side surface of the pressure touch sensing layer 141.

The first and second electrode portions 141c and 141d are connected to each other by the first and second connection parts 213 and 214 that are integrally formed with each other. Therefore, when the flexible circuit board is connected to the first and second electrode portions 141c and 141d to be electrically connected to the circuit board, one component is connected to each electrode portion, which can minimize a location change caused during a fixing process.

Although not illustrated, the flexible circuit board 210 may include a third connection portion electrically connected to a touch sensor included in the display unit 151. The third connection portion may also extend from the extension portion 212.

Figure 9:
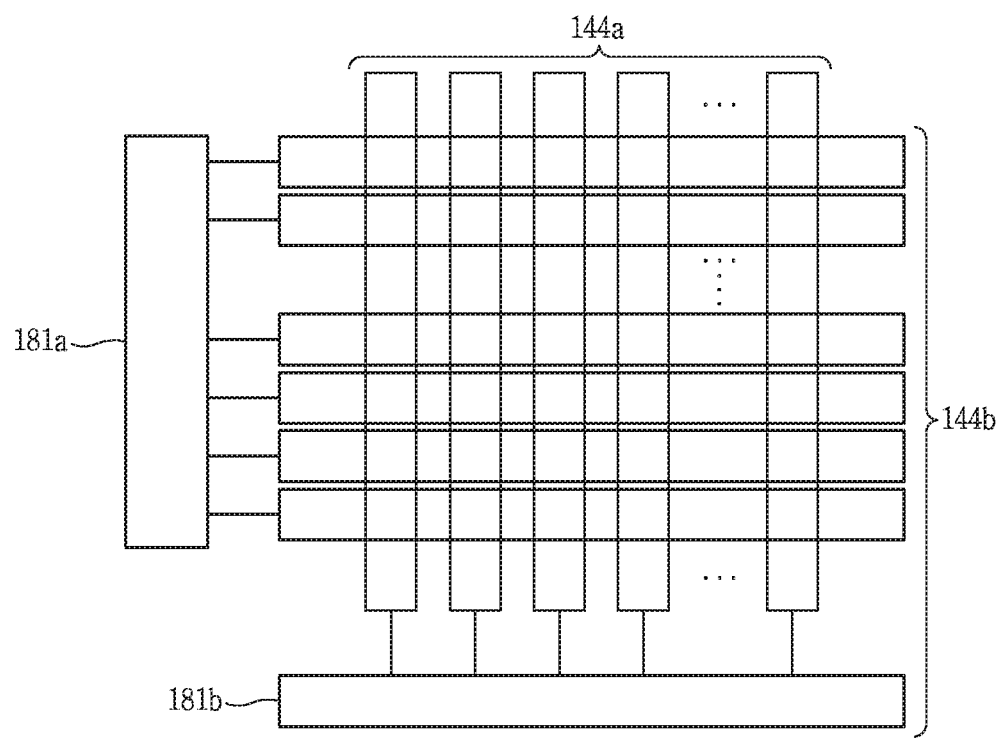
FIG. 9 is a conceptual view illustrating a pressure touch sensing layer in accordance with another embodiment.

FIG. 9 is a conceptual view illustrating a pressure touch sensing layer according to another embodiment.

Referring to FIG. 9, the pressure touch sensing layer includes a plurality of first conductive layers 144a extending in a first direction and a plurality of second conductive layers 144b extending in a second direction intersecting with the first direction. The first and second conductive layers 144a and 144b are electrically connected to the first and second circuit boards 181a and 181b, respectively.

Although not illustrated in detail, a deformation layer that is deformed by an external force is disposed between the first and second conductive layers 144a and 144b. When an external force is applied to the window or the like, a change in capacitance is detected as a distance between the first and second conductive layers 144a and 144b is shortened. Touch pressure may be detected based on the change in the capacitance.

Figure 10A:
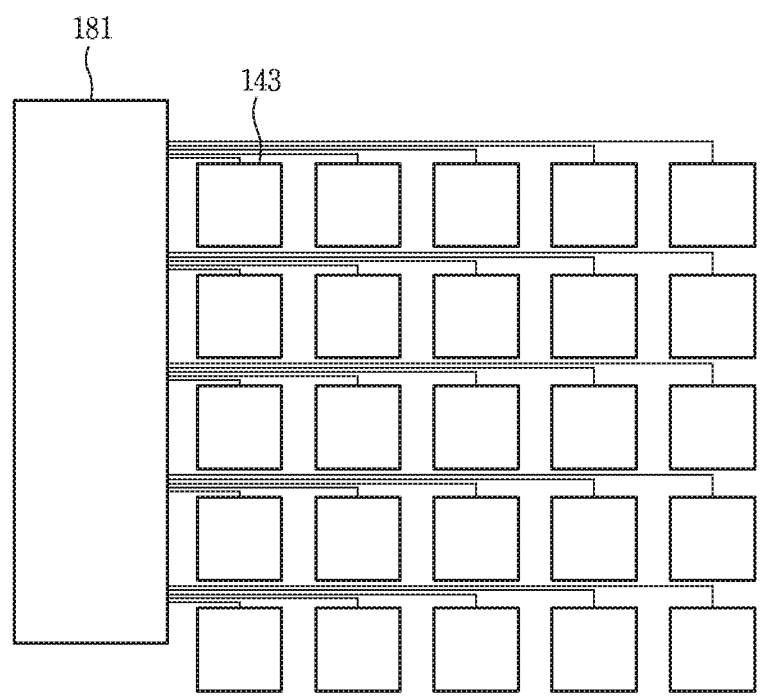
FIG. 10A is a conceptual view illustrating a structure of a pressure touch sensing layer in accordance with one embodiment of the present invention.
Figure 10B:
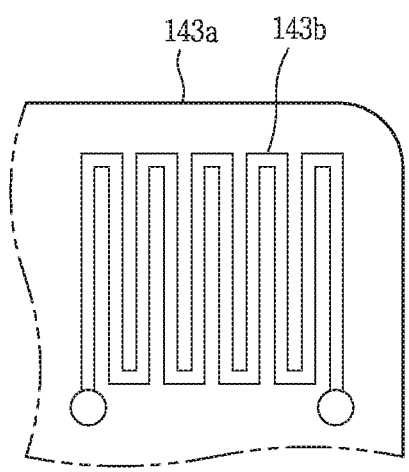
FIGS. 10B to 10D are conceptual views illustrating shapes of electronic patterns in accordance with various embodiments.
Figure 10C:
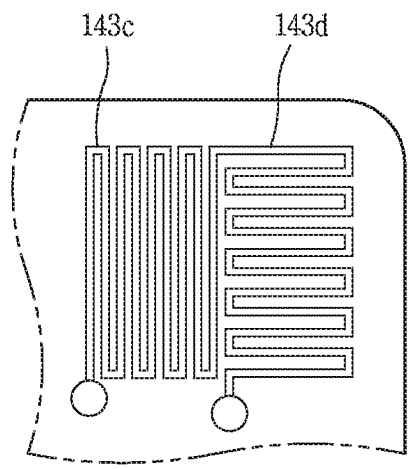
Figure 10D:
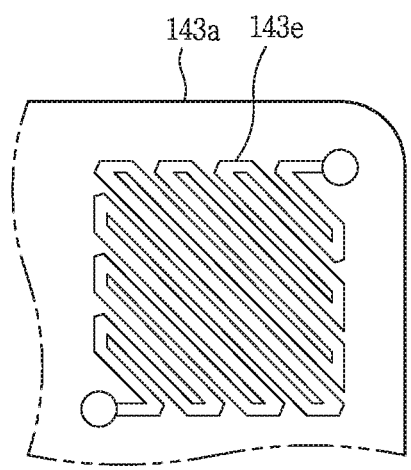

FIG. 10A is a conceptual view illustrating a structure of a pressure touch sensing layer according to one embodiment of the present invention, and FIGS. 10B to 10D are conceptual views illustrating shapes of electrode patterns according to various embodiments.

Referring to FIG. 10A, the pressure touch sensing layer includes a plurality of electrode portions 143. The plurality of electrode portions 143 may correspond to a plurality of pixels constituting a display of the display module 151b, respectively. Each of the plurality of electrode portions 143 detect a change in self-capacitance.

In the pressure touch sensing layer 141 according to this embodiment, when a current is discharged by a finger, capacitance to be sensed increases, and each of the plurality of electrode portions 143 is electrically connected to an electrode pad to be connected to the circuit board 180.

Referring to FIGS. 10B to 10D, a first metal pattern 143b of FIG. 10B is printed on a base substrate 143a. The first metal pattern 143b according to this embodiment is implemented such that electrodes are connected to both ends thereof and each portions thereof has the same length and is connected in parallel to one another.

A second metal pattern of FIG. 10C includes first and second patterns 143c and 143d printed on the base substrate 143a and having shapes extending in different directions, and the first and second patterns (143c, 143d) are connected to each other. Electrodes are connected to both ends of the connected first and second patterns 143c and 143d.

A third metal pattern 143e of FIG. 10D has a shape of extending in a diagonal direction of one rectangular cell of the base substrate 143a. However, the metal pattern of the pressure touch sensing layer according to the present invention is not limited thereto.

Figure 11:
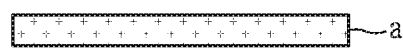
FIG. 11 is a conceptual view illustrating a heat dissipation structure in accordance with various embodiments.
Figure 11:
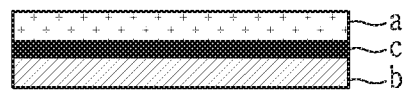
Figure 11:
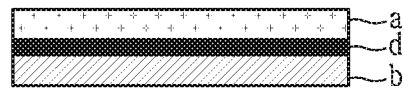
Figure 11:
Figure 11:

FIG. 11 is a conceptual view illustrating a heat dissipation structure according to various embodiments.

The electronic device according to the present invention includes a plurality of heat dissipation layers. Each heat dissipation layer is disposed between a plurality of components to diffuse heat or transfer diffused heat to a metal case so as to transfer heat generated inside the electronic device to outside. Such a heat dissipation layer may be formed in various shapes.

Referring to (a) of FIG. 11, the heat dissipation layer may be a PGS alloy layer a. The PGS alloy layer is an alloy made of platinum, gold, silver or the like, and may diffuse heat generated inside the electronic device and transfer it to an outer case.

Referring to (b) of FIG. 11, the heat dissipation layer includes a PGS alloy layer a, a separating paper b, and a double-sided adhesive sheet c.

The heat dissipation layer according to (c) of FIG. 11 includes a PGS alloy layer a, a separating paper b, and a heat-resistant adhesive sheet d. Accordingly, the heat dissipation layer may be arranged in an area where much heat is generated.

The heat dissipation layer according to (d) of FIG. 11 includes a PGS alloy layer a, and a polyester adhesive sheet e. The heat dissipation layer according to (e) of FIG. 11 includes a PGS alloy layer a, and a polymide adhesive sheet f. Thus, an insulating structure can be implemented when the heat dissipation layer is disposed adjacent to other conductive elements.

Figure 12:
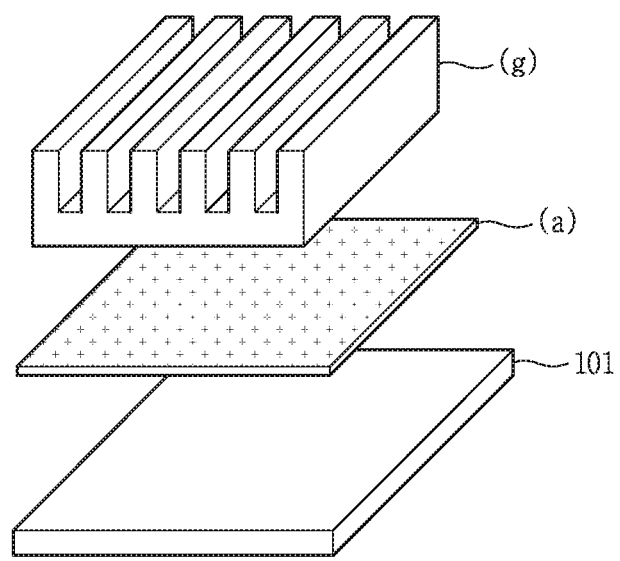
FIG. 12 is a conceptual view illustrating a heat dissipation layer including a heat sink.

FIG. 12 is a conceptual view illustrating a heat dissipation layer including a heat sink.

Referring to FIG. 12, for example, the heat dissipation layer is mounted on the inner frame 101, and includes a PGS alloy layer a and a heat sink g. The heat sink g may be disposed in an area spaced apart from a heat generation area. The heat is conducted by the PGS alloy layer a and is discharged to outside by the heat sink g.

A display unit according to one embodiment of the present invention corresponds to an OLED display. Hereinafter, a structure of an OLED display module will be described.

FIGS. 13A to 13F are conceptual vies illustrating a configuration of an OLED display module.

Figure 13A:
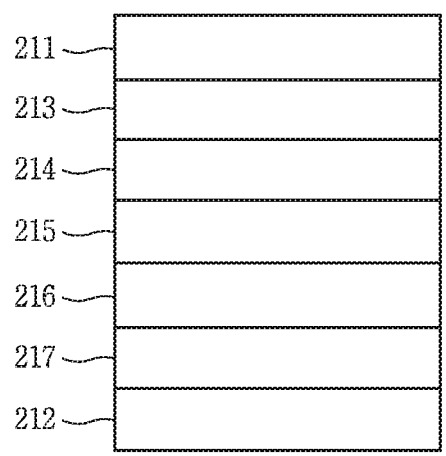
FIGS. 13A to 13F are conceptual views illustrating an OLED display module.

Hereinafter, components of an OLED laminate 210 will be described with reference to FIG. 13A. The OLED laminate 210 includes a cathode electrode layer 211, an anode electrode layer 212, and an organic layer disposed between the first and second electrode layers 211 and 212. The organic layer includes a hole injection layer 217, a hole transport layer 216, a light emitting layer 215, an electron transport layer 214, and an electron injection layer 213 which are sequentially laminated.

An electrode flows from the cathode electrode 211 to the anode electrode 212 and electrons are emitted from an organic material adjacent to the anode electrode 212 and injected into an organic material adjacent to the cathode electrode 211. The electrons flow out of the hole injection layer 217. The electrons are then transported to the hole transport layer 216, and injected into the electron injection layer 213.

During the process of transporting and injecting holes and electrons, the electrons are transported from the hole injection layer 217 through the hole transport layer 216 and the electron transport layer 214 and then injected into the electron injection layer 213. The electrons are changed into an excited state of emitting radiation having a frequency of a visible area, so as to promote the bonding between the holes of the light emitting layer 215. The characteristics of the frequency of the emitted radiation and/or a color of visible light depend on properties of a particular material used in the OLED laminate 210.

Figure 13B:
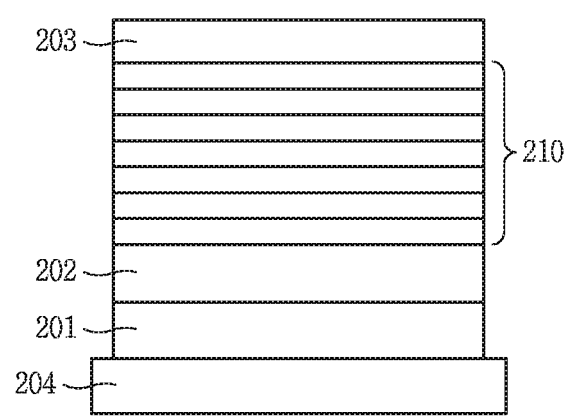

FIG. 13B illustrates an OLED display module 200 that includes the OLED laminate 210. The OLED laminate 210 includes a substrate 204, a thermal conductive layer 201, a polyimide layer 202, and an encapsulating member layer 203. The polyimide layer 202 serves as an insulator between the OLED laminate 210 and the thermal conductive layer 201. The encapsulating member layer 203 is formed on the OLED laminate 210 to define an outer surface of the OLED laminate 210.

Figure 13C:
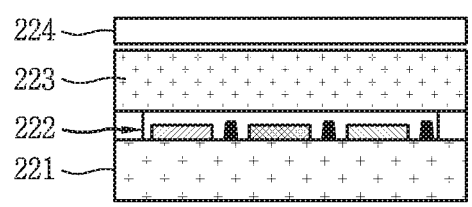
Figure 13D:
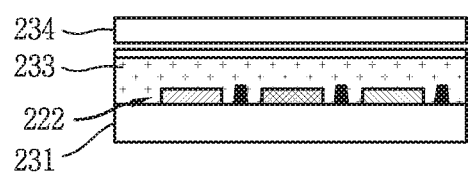

Hereinafter, the OLED structure will be described with reference to FIGS. 13C and 13D. FIG. 13C illustrates a glass OLED, and FIG. 13D illustrates a plastic OLED.

The glass OLED 210 includes a TFT substrate 221, an OLED layer 222, a cover layer 223 and a polarizing layer 224. The TFT substrate 221 and the encapsulating member layer 223 are made of a glass material and the OLED layer 222 is disposed between the TFT substrate 221 and the encapsulating member layer 223. The polarizing layer 224 is disposed on the encapsulating member layer 223 to polarize light. Unlike an LCD, the glass OLED 210 does not need a backlight unit that emits light.

The plastic OLED 230 includes a TFT substrate 231 made of a plastic material, the OLED layer 222 formed on the TFT substrate 231, and an encapsulating member layer 223 covering the OLED layer 222. A polarizing layer 234 is formed on an upper surface of the encapsulating member layer 223.

Figure 13E:
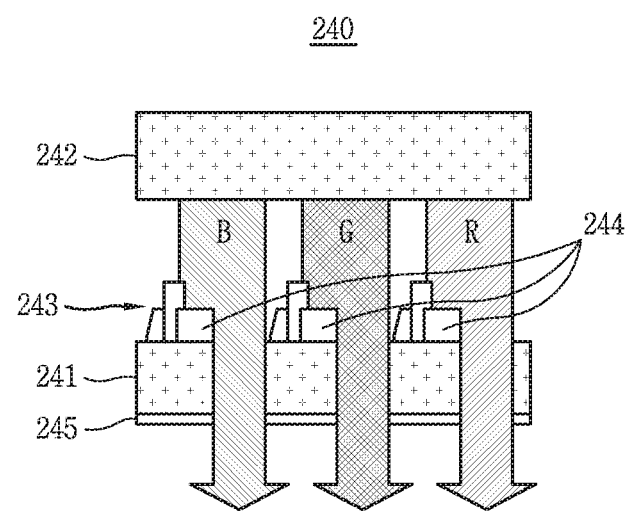
Figure 13F:
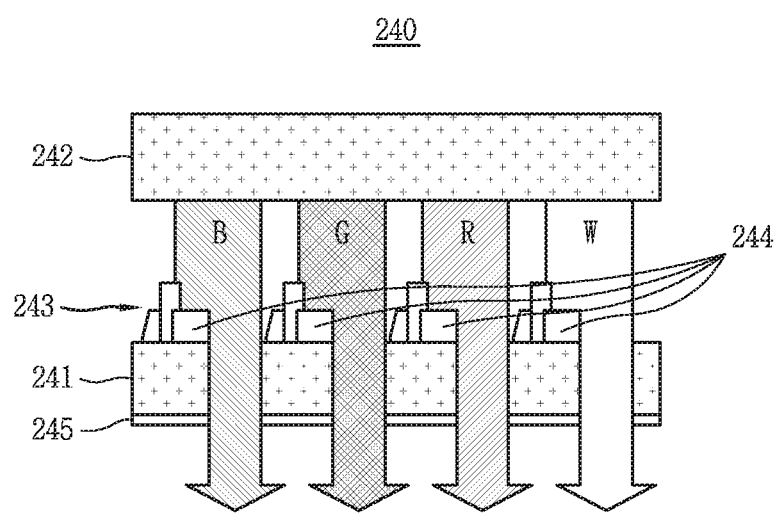

FIGS. 13E and 13F illustrate an OLED according to a light color of the OLED layer. The OLED of FIG. 13E includes an OLED layer 243 that outputs red light, blue light, and green light, and the OLED of FIG. 13F includes an OLED layer 245 that outputs white light, and a color filter layer 246. The white light passes through the color filter layer 246 so that red light, blue light, and green light can be output.

A TFT layer 244 and the OLED layers 243 and 245 (and the color filter layer 246) are disposed between the first and second glass substrates 241 and 242. A polarizing layer 245 is disposed beneath the second glass substrate 242.

Figure 14A:
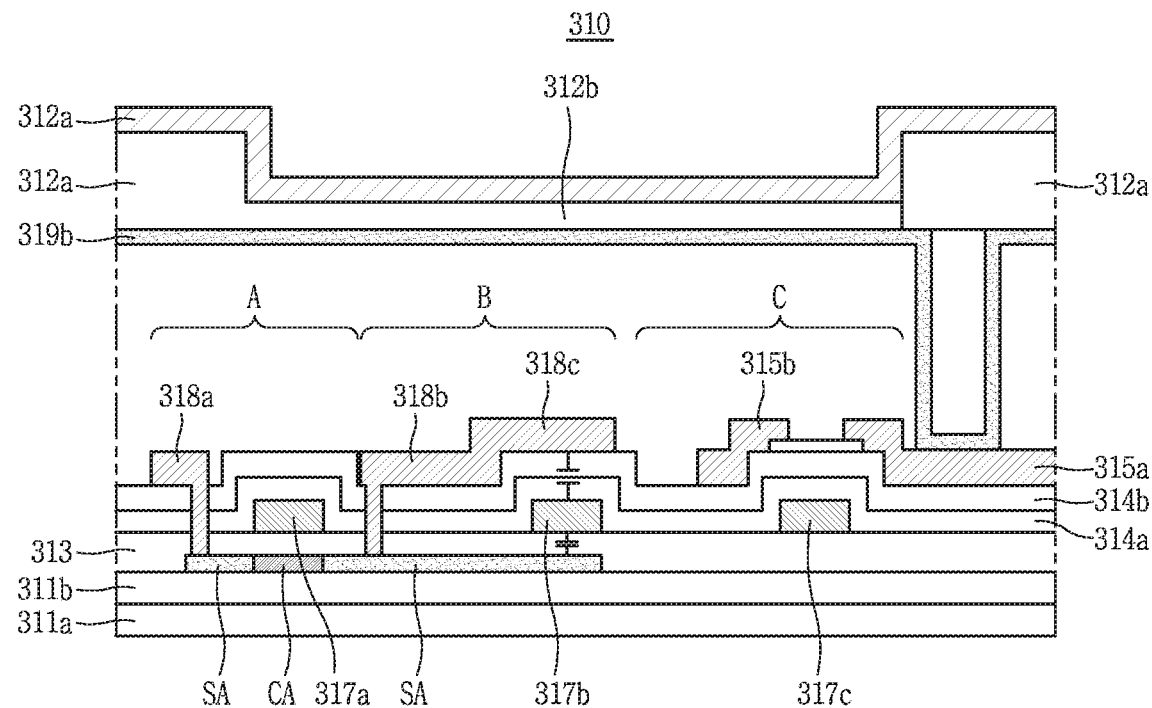
FIGS. 14A and 14B are conceptual views illustrating a thin-film transistor (TFT) layer.
Figure 14B:
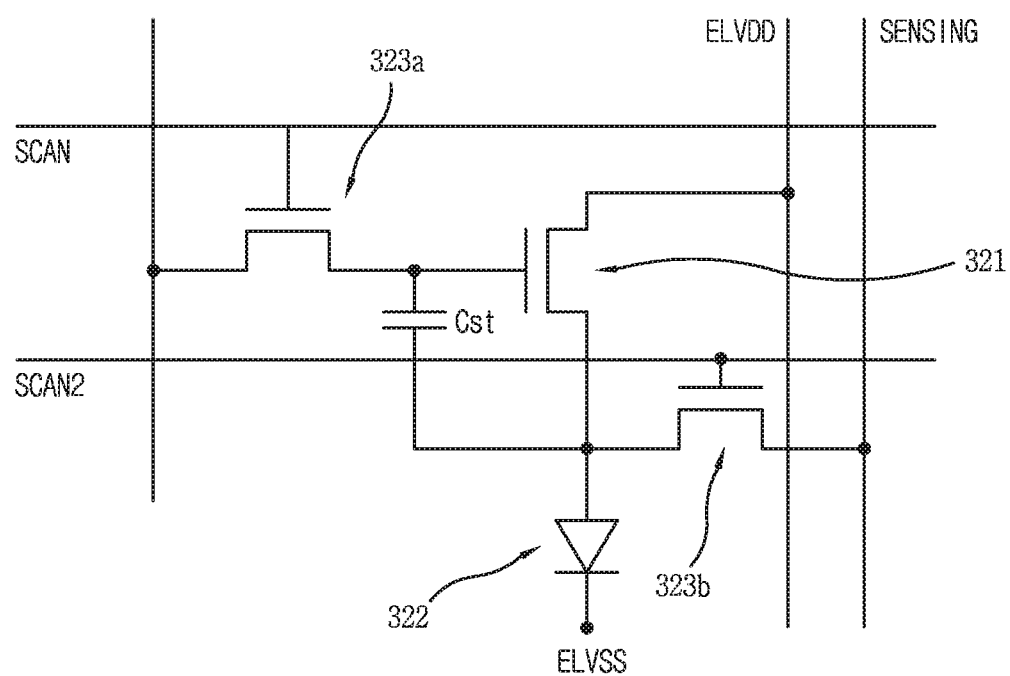

FIGS. 14A and 14B are conceptual views illustrating a TFT layer.

A hybrid TFT structure 310 will be described with reference to FIG. 14A. A silicon transistor 108 is formed of a polysilicon layer. A gate insulating layer 313 is formed to cover the polysilicon layer and a gate metal layer is patterned on a gate to form a capacitor electrode 318c and a gate electrode. Dielectric layers, such as a silicon nitride layer 314a and a silicon oxide layer 314b, are formed to cover the patterned gate metal structure.

Source and drain contacts 315b and 315a for a silicon transistor A may be in contact with a polysilicon layer in the vicinity of a channel region CA.

A gate 317a of the silicon transistor A may be implemented such that a low-density drain implant is formed in the polysilicon layer within an area SA adjacent to the polysilicon channel region CA of the gate 317a of the transistor A.

The silicon transistor A of the oxide transistor C, the capacitor electrode 318c and the source and drain contacts 315b and 315a may correspond to patterned portions of a common metal layer on the interlayer dielectric layers 314a and 314b.

A capacitor B may include the capacitor electrode 318c, and a first terminal implemented as a portion 317b of the polysilicon layer 90. The capacitor B may have a second terminal implemented as a metal electrode.

An oxide transistor C may include an IGZO layer 128, the source and drain contacts 315b and 315a, and a semiconductor oxide layer, such as the gate 317c. The gate 317c serves as a channel area with respect to the transistor C by the dielectric layer 314a, and the semiconductor oxide dielectrics 314a and 314b serve as a gate insulator with respect to the oxide transistor C.

Hereinafter, a circuitry view of an organic light emitting diode pixel circuit according to one embodiment will be described with reference to FIG. 14B. A pixel includes a driving transistor 321 for driving current to a light emitting diode 322. A storage capacitor Cst stores a signal of a gate of the transistor 321 between frames. A sensing line (SENSING) calibrates a difference of a transistor performance (efficiency) between pixels. Gate lines SCAN and SCAN 2 apply a control signal of switching transistors 323a and 323b.

The present invention can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:
1. An electronic device, comprising:
a window defining an outer surface of a main body, and having a pressure touch receiving area for receiving a pressure touch input;
a metal case supporting the window and defining the outer surface of the main body;
an organic light emitting diode (OLED) display module disposed beneath the window and configured to output visual information through the window;
a metal support frame supporting the OLED display module;
a guide frame supporting the OLED display module, and coupled to the window;
a pressure touch sensing unit disposed beneath the window and configured to detect a touch input applied to the window; and
wherein the pressure touch sensing unit comprises:
a first base substrate having a first electrode layer provided with a plurality of electrode lines on one surface thereof;
a second base substrate having a second electrode layer provided with a plurality of electrode lines on one surface thereof;
a graphite sheet disposed between the first base substrate and the metal support frame;
a deformation layer disposed on the first and second electrode layers; and
a circuit board electrically connected to the first and second electrode layers through a flexible circuit board,
wherein the first base substrate is deformed with respect to the second base substrate, in response to a pressure touch applied to the window, and
wherein the flexible circuit board includes a first connection portion, a second connection portion and a third connection portion,
wherein the first connection portion and the second connection portion are connected to electrode layers on different substrates wherein the first connection portion is connected to the first electrode layer disposed on a lower surface of the first base substrate and the second connection portion is connected to the second electrode layer disposed on an upper surface of the second base substrate different from the first base substrate, and
wherein the third connection portion is connected to the circuit board.

2. The device of claim 1, wherein the OLED display module, the metal support frame, the graphite sheet, and the pressure touch sensing unit are laminated on one another.

3. The device of claim 2, further comprising a second graphite sheet disposed beneath the pressure touch sensing unit, wherein the second graphite sheet is disposed beneath the second base substrate of the pressure touch sensing unit.

4. The device of claim 1, wherein the first base substrate, the second base substrates and the deformation layer are fixed by a guide mold.

5. The device of claim 4, further comprising a recess formed on one area of the guide mold so that the flexible circuit board is disposed therein.

6. The device of claim 4, wherein a thickness of the guide mold is larger than that of pressure touch sensing unit comprising the first base substrate and the second substrate such that the guide mold surrounds side surfaces of the first base substrates and the second substrates.

7. The device of claim 1, wherein the guide frame surrounds side surfaces of the first base substrate and the second substrate.

8. The device of claim 1, further comprising a touch sensing unit disposed beneath the pressure touch receiving area and configured to detect a touch input.

9. The device of claim 1, wherein the guide frame comprises:
a mold portion fixed to the window; and
a metal portion fixed to the mold portion, and having a first area for fixing the OLED display module, and a second area mounted on the metal case.

10. The device of claim 9, further comprising a coupling portion protruding from the mold portion to be coupled to the metal support frame, and having a hole through which a coupling member is inserted.

11. The device of claim 1, wherein the plurality of electrode lines of the first electrode layer extend in a first direction, and
wherein the plurality of electrode lines of the second electrode layer extend in a second direction intersecting with the first direction.

12. The device of claim 1, further comprising a first heat dissipation member disposed on another surface of the first base substrate and configured to diffuse heat generated, wherein the first heat dissipation member is implemented as a graphite layer and a copper layer.

13. The device of claim 1, further comprising a metal layer disposed between the metal support frame and the OLED display module, and configured to discharge generated heat through the metal case.

14. The device of claim 1, wherein the flexible circuit board further comprises an extension portion integrally formed with the first and second connection portions and extending up to the circuit board.

15. The device of claim 1, wherein the second base substrate is fixed only to the deformation layer and the first base substrate, and
wherein the first base substrate is attached only on the OLED display module.

16. The device of claim 1, wherein:
the first connection portion, the second connection portion and the third connection portion are integrally formed with each other,
the second connection portion is formed to extend from the first connection portion, and
the first connection portion and the second connection portion are spaced apart from each other such that a portion of the deformation layer is disposed between the first connection portion and the second connection portion.

17. An electronic device, comprising:
a window defining an outer surface of a main body, and having a pressure touch receiving area for receiving a pressure touch input;
a metal case supporting the window and defining the outer surface of the main body;
an organic light emitting diode (OLED) display module disposed beneath the window and configured to output visual information through the window;
a metal support frame supporting the OLED display module;
a guide frame supporting the OLED display module, and coupled to the window;
a pressure touch sensing unit disposed beneath the window and configured to detect a touch input applied to the window; and
wherein the pressure touch sensing unit comprises:
a first base substrate having a first electrode layer provided with a plurality of electrode lines on one surface thereof;
a second base substrate having a second electrode layer provided with a plurality of electrode lines on one surface thereof;
a graphite sheet disposed between the first base substrate and the metal support frame;
a deformation layer disposed on the first and second electrode layers; and
a circuit board electrically connected to the first and second electrode layers through a flexible circuit board,
wherein the first base substrate is deformed with respect to the second base substrate, in response to a pressure touch applied to the window, and
wherein the flexible circuit board includes a first connection portion, a second connection portion and a third connection portion,
wherein the first connection portion and the second connection portion are connected to electrode layers on different substrates wherein the first connection portion is connected to the first electrode layer disposed on a lower surface of the first base substrate and the second connection portion is connected to the second electrode layer at the second base substrate different from the first base substrate, and
wherein the third connection portion is connected to the circuit board.

* * * * *